(12) United States Patent
Kwak et al.

(10) Patent No.: US 12,349,520 B2
(45) Date of Patent: Jul. 1, 2025

(54) DISPLAY DEVICE

(71) Applicant: LG Display Co., Ltd., Seoul (KR)

(72) Inventors: YongSeok Kwak, Paju-si (KR);
Myungsoo Han, Goyang-si (KR);
Kiyong Yang, Seoul (KR); MinJae Kang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 932 days.

(21) Appl. No.: 16/713,463

(22) Filed: Dec. 13, 2019

(65) Prior Publication Data

US 2020/0212267 A1    Jul. 2, 2020

(30) Foreign Application Priority Data

Dec. 26, 2018    (KR) .................. 10-2018-0169401

(51) Int. Cl.
*H10H 20/851*    (2025.01)
*H01L 25/16*    (2023.01)
*H10H 20/01*    (2025.01)
*H10H 20/821*    (2025.01)
*H10H 20/856*    (2025.01)
*H10H 20/812*    (2025.01)
*H10H 20/825*    (2025.01)
*H10H 20/857*    (2025.01)

(52) U.S. Cl.
CPC ....... *H10H 20/8514* (2025.01); *H01L 25/167* (2013.01); *H10H 20/018* (2025.01); *H10H 20/821* (2025.01); *H10H 20/8513* (2025.01); *H10H 20/856* (2025.01); *H10H 20/0361* (2025.01); *H10H 20/0363* (2025.01); *H10H 20/0364* (2025.01); *H10H 20/812* (2025.01); *H10H 20/825* (2025.01); *H10H 20/857* (2025.01)

(58) Field of Classification Search
CPC .................. H01L 33/505; H10H 20/8514
USPC ........................................... 257/89
See application file for complete search history.

(56) References Cited

U.S. PATENT DOCUMENTS

2010/0244065 A1    9/2010  Butterworth
2011/0193123 A1    8/2011  Moon et al.
(Continued)

FOREIGN PATENT DOCUMENTS

CN    102760796 A    10/2012
CN    105474747 A    4/2016
(Continued)

OTHER PUBLICATIONS

Office Action issued in corresponding CN Application No. 201911257788.3, dated Jan. 18, 2023.
(Continued)

*Primary Examiner* — Hsin Yi Hsieh
(74) *Attorney, Agent, or Firm* — Morgan, Lewis & Bockius LLP

(57) ABSTRACT

A display device comprises a first substrate including a plurality of pixels, a plurality of light emitting diodes (LEDs) in each of the plurality of pixels, a plurality of light conversion units on the plurality of LEDs, and a plurality of partitions configured to surround each of the plurality of light conversion units. Each of the plurality of light conversion units is in a groove inside the plurality of partitions.

15 Claims, 19 Drawing Sheets

(56) References Cited

U.S. PATENT DOCUMENTS

| | | | |
|---|---|---|---|
| 2012/0276671 A1* | 11/2012 | Wei | H01L 21/02639 |
| | | | 257/E33.012 |
| 2014/0367633 A1 | 12/2014 | Bibl et al. | |
| 2016/0190105 A1 | 6/2016 | Rhee et al. | |
| 2017/0236866 A1 | 8/2017 | Lee et al. | |
| 2017/0250316 A1 | 8/2017 | Yeon et al. | |
| 2017/0338212 A1 | 11/2017 | Kuo et al. | |
| 2018/0047780 A1 | 2/2018 | Yeon et al. | |
| 2018/0074372 A1* | 3/2018 | Takeya | H01L 25/0753 |
| 2018/0166424 A1 | 6/2018 | Sim et al. | |
| 2018/0190740 A1 | 7/2018 | Bang et al. | |
| 2018/0211993 A1* | 7/2018 | Yeon | H01L 33/44 |
| 2019/0189853 A1* | 6/2019 | Yoo | H01L 33/385 |
| 2019/0189876 A1* | 6/2019 | Lee | H01L 25/0753 |
| 2020/0066787 A1* | 2/2020 | Park | H01L 27/156 |
| 2021/0391514 A1* | 12/2021 | Koyama | H01L 25/0753 |
| 2022/0093833 A1* | 3/2022 | Takiguchi | H01L 33/38 |

FOREIGN PATENT DOCUMENTS

| | | |
|---|---|---|
| CN | 107086226 A | 8/2017 |
| CN | 107134469 A | 9/2017 |
| CN | 107731861 A | 2/2018 |
| CN | 108231820 A | 6/2018 |
| CN | 108269833 A | 7/2018 |
| JP | 2011-166150 A | 8/2011 |
| KR | 10-2016-0010869 A | 1/2016 |
| KR | 10-2018-0017914 A | 2/2018 |

OTHER PUBLICATIONS

Office action issued Sep. 29, 2023, by the Korean Patent Office corresponding to KR Patent Application No. 10-2018-0169401.
Office Action issued in corresponding Chinese Patent Application No. 201911257788.3, dated Jun. 30, 2023. Note: CN107731861A and CN108269833A cited therein are already of record.

* cited by examiner (a)

(b)

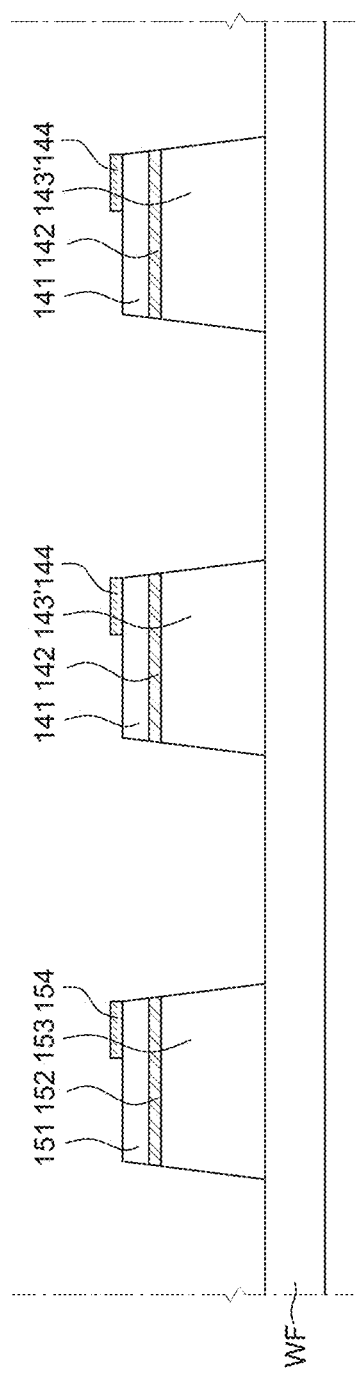

DISPLAY DEVICE

CROSS-REFERENCE TO RELATED APPLICATIONS

This application claims the benefit of Korean Patent Application No. 10-2018-0169401 filed on Dec. 26, 2018, in the Korean Intellectual Property Office, the disclosure of which is incorporated by reference in its entirety.

BACKGROUND

Technical Field

The present disclosure relates to a display device, and more particularly, to a display device using a micro light emitting diode (micro LED).

Related Technology

A display device used for apparatuses such a monitor of a computer, a TV, or a mobile phone may include an organic light emitting display (OLED) that emits light by itself, or a liquid crystal display (LCD) that requires a separate light source.

Display devices have been widely used not only in computer monitors and televisions, but also in personal portable devices. Studies continue to be made on display devices having a reduced display area and a reduced volume and weight.

In addition, in recent years, a display device including an LED has attracted attention as a next generation display device. The LED may be made of an inorganic material, not an organic material, and thus may have excellent reliability and a longer lifetime than a liquid crystal display device or an organic light emitting display device. Further, the LED may not only have a fast emitting speed, but also may have excellent luminous efficiency, excellent impact resistance, excellent stability, and the ability to display a high-brightness image.

In LED manufacturing, a plurality of LEDs may be formed by growing an epi layer in one wafer and patterning the epi layer. Then, the LED manufactured on the wafer may be transferred to the backplane substrate to form a display device. However, there may be a problem that it is difficult to simultaneously grow a red LED, a green LED, and a blue LED on one wafer. Accordingly, a plurality of LEDs emitting light of a single color, which are grown on one wafer, may be transferred to the backplane substrate, and light conversion units are arranged on the plurality of LEDs to realize light of various colors.

For example, a black matrix is disposed between a plurality of LEDs emitting light of a single color, and then a material including a phosphor is applied to a space between the black matrix to form a plurality of light conversion units. For example, a photoresist containing a phosphor is applied to a plurality of LEDs by a spin coating method to implement a plurality of light conversion units. In the case of a photoresist containing a phosphor, the thickness that can be achieved by one spin coating may be in the range of 1 μm to 2 μm. Therefore, a sufficient amount of the phosphor may barely be coated on a plurality of LEDs in one step, which may lead to a decrease in the light conversion efficiency. Thus, a photoresist containing a phosphor may be coated several times on a plurality of LEDs to form a plurality of light conversion units having a multi-layered film.

However, when the photoresist is applied, misalignment and the like may occur, and the arrangement of the plurality of light conversion units may be distorted. As the number of processes increases, material may be also consumed in an enormous amount. Therefore, in the method of coating and coating the phosphor on a plurality of LEDs, it may be difficult to form a light conversion unit having high light conversion efficiency, and the required brightness of the display device and power consumption may be increased.

In addition, by disposing the black matrix between the plurality of LEDs, the light emitted to the sides of the plurality of LEDs may not be emitted to the upper side of the backplane substrate, and may be absorbed by the black matrix, resulting in light loss.

SUMMARY

Accordingly, the present disclosure is directed to a display device that substantially obviates one or more of the problems due to limitations and disadvantages of the related art.

Therefore, the inventors of the present disclosure have invented a display device that may be capable of increasing the thickness of a plurality of light conversion units to improve light conversion efficiency and reduce light loss to the sides of a plurality of LEDs.

An object of the present disclosure is to provide a display device capable of increasing the thickness of the plurality of light conversion units.

Another object of the present disclosure is to provide a display device in which the thickness of a plurality of light conversion units is increased, and a material consumption amount necessary for forming a plurality of light conversion units is reduced and possibly minimized.

Another object of the present disclosure is to provide a display device capable of redirecting emitting light toward the side of a plurality of LEDs toward to the upper side of the plurality of LEDs.

Another object of the present disclosure is to provide a display device in which the light converted by the plurality of light conversion units is minimally reabsorbed by a plurality of LEDs.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, a display device according to an embodiment of the present disclosure may include a first substrate including a plurality of pixels; a plurality of light emitting diodes (LEDs) in each of the plurality of pixels; a plurality of light conversion units on the plurality of LEDs; and a plurality of partitions configured to surround each of the plurality of light conversion units, wherein each of the plurality of light conversion units is in a groove inside the plurality of partitions.

In another aspect, a display device according to another embodiment of the present disclosure may include a first substrate on which a plurality of sub-pixels is defined; a plurality of inorganic light emitting structures in the plurality of sub-pixels, wherein an upper surface of the plurality of inorganic light emitting structures includes a groove; a plurality of light conversion units in the groove; and a first reflector between adjacent inorganic light emitting structures and configured to reflect light emitted from the plurality of inorganic light emitting structures to thereby improve light extraction efficiency of the plurality of inorganic light emitting structures.

In another aspect, a display device according to another embodiment of the present disclosure may include a substrate; a pixel on the substrate, the pixel including a plurality of light-emitting diodes (LEDs); a light conversion unit in a groove on one or more of the LEDs; and a reflector in the groove between the one or more LEDs and the light conversion unit to reflect light converted by the light conversion unit.

The details of the embodiments of the present disclosure are included in the detailed description and drawings.

According to the present disclosure, the conversion efficiency of light emitted from a plurality of LEDs may be increased by increasing the thickness of the plurality of light conversion units.

According to the present disclosure, the material required for forming a plurality of light conversion units may be reduced and possibly minimized while increasing the thickness of the plurality of light conversion units.

According to the present disclosure, light extraction efficiency may be increased by reflecting light emitted to side surfaces of a plurality of LEDs to the upper side of the plurality of LEDs.

According to the present disclosure, the light extraction efficiency may be improved by reflecting light directed toward a plurality of LEDs out of the light converted by the plurality of light conversion units to the upper side of the plurality of LEDs.

The effects according to the present disclosure are not limited by the contents exemplified above, and more various effects are included in the present disclosure.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings:

FIGS. 3A to 3M are schematic process diagrams illustrating a method of manufacturing a display device and a display device according to an embodiment of the present disclosure.

DETAILED DESCRIPTION

Figure 1:
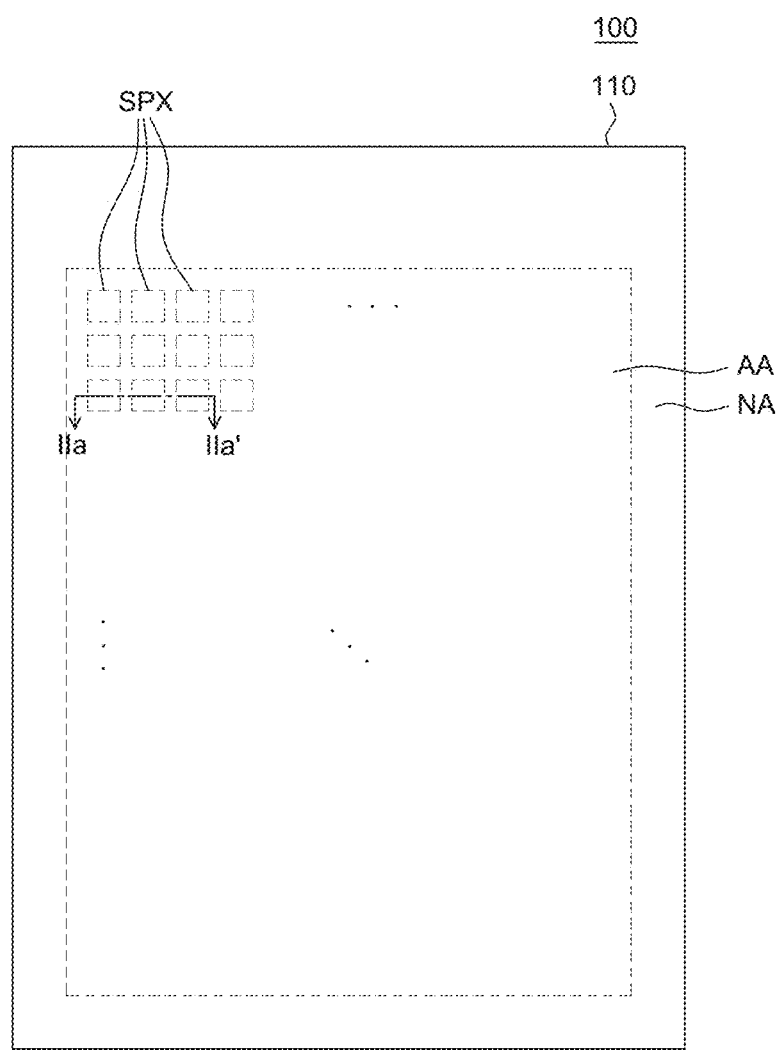
FIG. 1 is a schematic plan view of a display device according to an embodiment of the present disclosure.

Reference will now be made in detail to embodiments of the present disclosure, examples of which are illustrated in the accompanying drawings.

Advantages and characteristics of the present disclosure and a method of achieving the advantages and characteristics will be clear by referring to the embodiments described below in detail together with the accompanying drawings. However, the present disclosure is not limited to the embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only." Any references to singular may include plural unless expressly stated otherwise.

Components are interpreted to include an ordinary error range (e.g., a tolerance range) even if not expressly stated.

When the position relation between two elements is described using the terms such as "on," "above," "below," and "next," one or more elements may be positioned between the two parts unless the terms are used with the term "immediately" or "directly."

When an element or a layer is "on" another element or another layer, it may be interpreted as such the other layer or the other element can be interposed on or in the middle of another element.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals refer to like elements throughout the specification.

Area and thickness of each element shown in the figures are merely for illustrative purpose for convenience of description, but are not necessarily limited to the area and thickness of the configuration of the present disclosure as illustrated.

Each of the features of the various embodiments of the present disclosure can be combined or combined with each other partly or entirely. The features of the various embodiments can be technically interlocked and driven as well. The features of the various embodiments can be practiced independently or in conjunction with each other independently of each other.

Hereinafter, various embodiments of the present disclosure will be described in detail with reference to accompanying drawings.

FIG. 1 is a schematic plan view of a display device 100 according to an embodiment of the present disclosure. In FIG. 1, only the first substrate 110 and the sub-pixels SPX among the various elements of the display device 100 are shown for convenience of explanation.

The first substrate 110 is configured to support various elements included in the display device 100 and may be formed of an insulating material. For example, the first substrate 110 may be made of glass, resin, or the like. In addition, the first substrate 110 may be made of a polymer or plastic, or may be made of a material having flexibility. For example, the first substrate 110 may be a silicon substrate.

The first substrate 110 includes a display area AA and a non-display area NA. The display area AA is an area in which a plurality of sub-pixels SPX constituting a plurality of pixels is disposed and an image is displayed. Each of the plurality of sub-pixels SPX of the display area AA may be provided with a light emitting element and a driving circuit for driving the light emitting element. For example, each of the plurality of sub-pixels SPX may be provided with a LED and a semiconductor element or the like for driving the LED.

The non-display area NA is an area in which no image is displayed, and is an area in which various wirings, driver integrated circuits (ICs), and the like for driving the sub-pixels SPX arranged in the display area AA are arranged. For example, various ICs and driver circuits, such as a gate driver IC and a data driver IC, may be disposed in the non-display area NA. On the other hand, the non-display area NA may be located on the bottom surface of the first substrate 110, that is, on the surface where the sub-pixel SPX is not disposed, or may be omitted.

In the display area AA of the first substrate 110, a plurality of sub-pixels SPX are defined. Each of the plurality of sub-pixels SPX is a separate unit for emitting light, and LEDs and semiconductor elements are formed in each of the plurality of sub-pixels SPX. For example, the plurality of sub-pixels SPX may include red sub-pixels, green sub-pixels, and blue sub-pixels, but the present disclosure is not limited thereto.

Figure 2A:
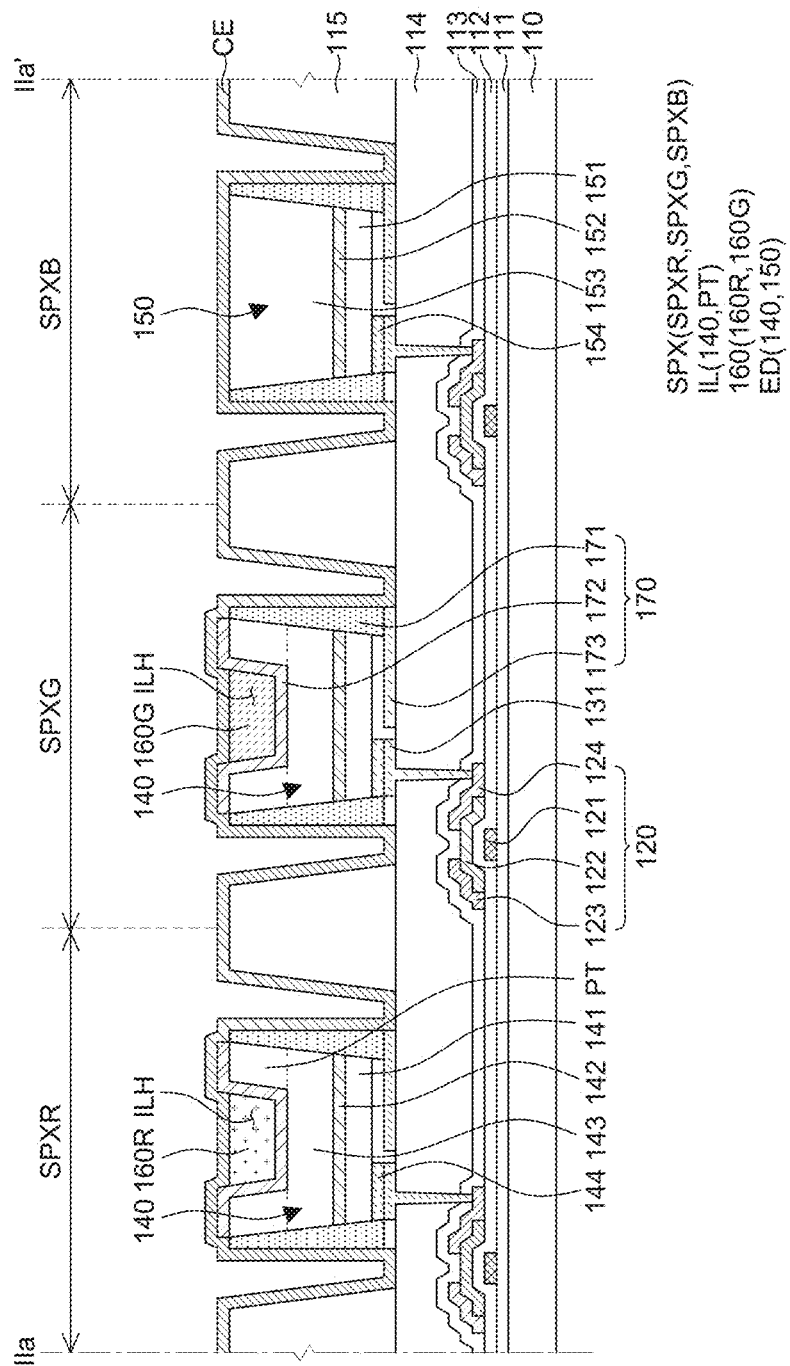
FIG. 2A is a cross-sectional view taken along line IIa-IIa' of FIG. 1.
Figure 2B:
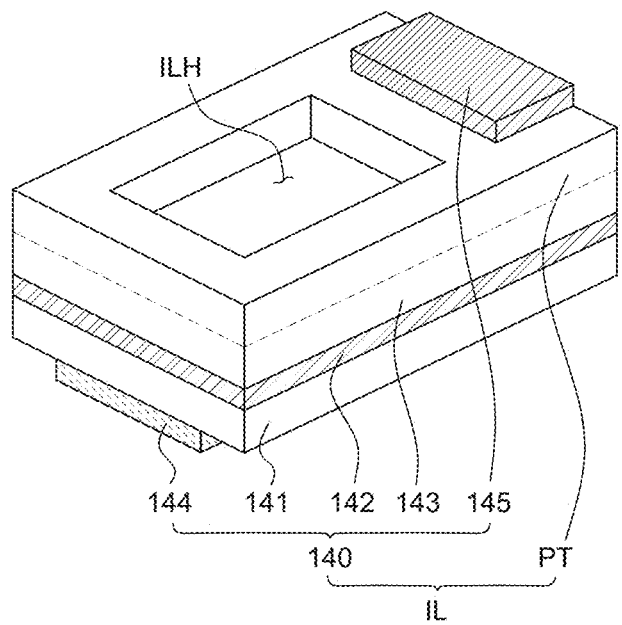
FIG. 2B is a perspective view of a plurality of LEDs of a display device according to an embodiment of the present disclosure.
Figure 2B:
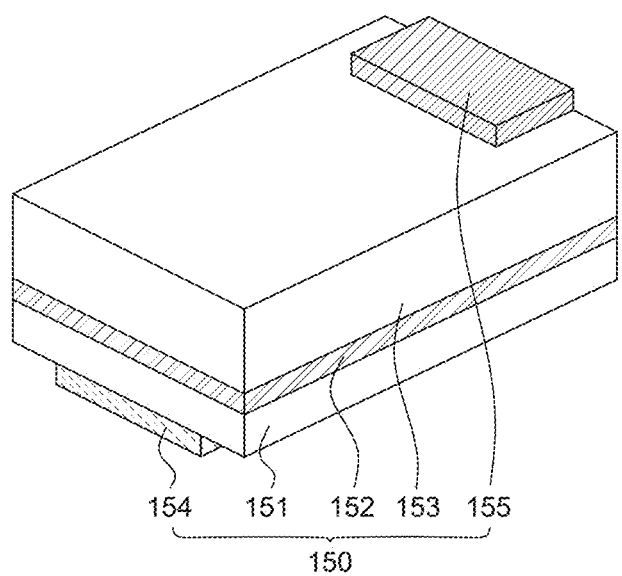

Hereinafter, FIGS. 2A and 2B will be referenced for a more detailed description of the plurality of sub-pixels SPX. FIG. 2A is a cross-sectional view taken along line IIa-IIa' of FIG. 1. FIG. 2B is a perspective view of a plurality of LEDs of a display device according to an embodiment of the present disclosure. Part (a) of FIG. 2B is a perspective view of an inorganic light emitting structure IL including a first LED 140 and a partition PT of a display device 100 according to an embodiment of the present disclosure, and part (b) of FIG. 2B is a perspective view of a second LED 150 according to an embodiment of the present disclosure. With reference to FIGS. 2A and 2B, a display device 100 according to an example embodiment of the present disclosure includes a first substrate 110, a buffer layer 111, a gate insulating layer 112, a passivation layer 113, a planarization layer 114, a bank 115, a plurality of semiconductor elements 120, a contact electrode 131, a plurality of LEDs ED including a plurality of first LEDs 140 and a plurality of second LEDs 150, a plurality of partitions PT, a plurality of light conversion units 160, a plurality of reflectors 170, and a common electrode CE.

With reference to FIG. 2A, a buffer layer 111 is disposed on a first substrate 110. The buffer layer 111 can reduce and possibly minimize the diffusion of moisture or impurities from the first substrate 110. The buffer layer 111 may be made of a single layer or a plurality of layers of silicon oxide (SiOx) or silicon nitride (SiNx), but the present disclosure is not limited thereto.

A plurality of semiconductor elements 120 is disposed on the buffer layer 111. The plurality of semiconductor elements 120 may be used as a driving element of a display device. For example, the plurality of semiconductor elements 120 may be a thin film transistor (TFT), an n-channel metal oxide semiconductor (NMOS), a p-channel metal oxide semiconductor (PMOS), Complementary Metal Oxide Semiconductor (CMOS), Field Effect Transistor (FET), and the like, but the present disclosure is not limited thereto. Hereinafter, for convenience of description, it is assumed that the plurality of semiconductor elements 120 are thin-film transistors, but the present disclosure is not limited thereto.

Each of the plurality of semiconductor elements 120 includes a gate electrode 121, an active layer 122, a source electrode 123, and a drain electrode 124.

The gate electrode 121 is disposed on the buffer layer 111. The gate electrode 121 may be formed of a conductive material, for example, copper (Cu), aluminum (Al), molybdenum (Mo), titanium (Ti), or an alloy thereof, but the present disclosure is not limited thereto.

The gate insulating layer 112 is disposed on the gate electrode 121. The gate insulating layer 112 is a layer for insulating the gate electrode 121 from the active layer 122, and may be made of an insulating material. For example, the gate insulating layer 112 may be made of a single layer or a multiple layer of silicon oxide (SiOx) or silicon nitride (SiNx), but the present disclosure is not limited thereto.

The active layer 122 is disposed on the gate insulating layer 112. For example, the active layer 122 may be formed of an oxide semiconductor, amorphous silicon, polysilicon or the like, but the present disclosure is not limited thereto.

A source electrode 123 and a drain electrode 124 are disposed apart from each other on the active layer 122. The source electrode 123 and the drain electrode 124 may be electrically connected to the active layer 122. The source electrode 123 and the drain electrode 124 may be formed of a conductive material such as copper (Cu), aluminum (Al), molybdenum (Mo), titanium (Ti), but the present disclosure is not limited thereto.

A passivation layer 113 is disposed on the plurality of semiconductor elements 120. The passivation layer 113 is an insulating layer for protecting the structure under the passivation layer 113. For example, the passivation layer 113 may be made of a single layer or a multiple layer of silicon oxide (SiOx) or silicon nitride (SiNx), but the present disclosure is not limited thereto.

A planarization layer 114 is disposed on the passivation layer 113. The planarization layer 114 may planarize an upper side of the first substrate 110 including the plurality of semiconductor elements 120. The planarization layer 114 may be made of a single layer or a multi-layer, and may be formed of an organic material. For example, the planarization layer 114 may be made of an acryl based organic material, but the present disclosure is not limited thereto.

A plurality of contact electrodes 131 is disposed on the planarization layer 114. The plurality of contact electrodes 131 may electrically connect each of the plurality of semiconductor elements 120 and each of the plurality of LEDs ED. For example, the plurality of contact electrodes 131 may be electrically connected to the drain electrodes 124 of the plurality of semiconductor elements 120 through the contact holes formed in the passivation layer 113 and the planarization layer 114, and may be electrically connected to each of the plurality of LEDs ED. For example, the plurality of contact electrodes 131 may be formed of tin oxide (TO), indium tin oxide (ITO), indium zinc oxide (IZO), indium zinc tin oxide (IZTO), and the like and may be made of the same material as the gate electrode 121, the source electrode 123 and the drain electrode 124 of the semiconductor element 120, but the present disclosure is not limited thereto.

In addition, the plurality of contact electrodes 131 may be electrodes for bonding a plurality of LEDs ED. In this case, the plurality of contact electrodes 131 may be made of eutectic metal, and may be made of, for example, tin (Sn), indium (In), zinc (Zn), lead (Pb), nickel (Ni), gold (Au), platinum (Pt), copper (Cu), and the like, but the present disclosure is not limited thereto.

The bank 115 is disposed on the plurality of contact electrodes 131 and the planarization layer 114. The bank 115 is an insulating layer for distinguishing a plurality of sub-pixels SPX adjacent to each other. The bank 115 may be disposed at a boundary between the plurality of sub-pixels SPX. The bank 115 may be arranged to open a plurality of contact electrodes 131, and may be made of an organic insulating material, but the present disclosure is not limited thereto.

A plurality of LEDs ED is disposed on the plurality of contact electrodes 131. A plurality of LEDs ED is disposed in each of the plurality of sub-pixels SPX. Each of the plurality of LEDs ED is a light emitting element that emits light when a particular voltage is applied. The plurality of LEDs ED may include LEDs that emit red light, green light, blue light, ultraviolet light, or the like, and combinations of these may realize light of various colors including white.

The plurality of LEDs ED may be formed in various structures such as lateral type, vertical type, and flip type. The lateral type LED includes a light emitting layer and an N-type electrode and a P-type electrode arranged laterally on the light emitting layer. The lateral type LED may emit light by combining electrons supplied to the light emitting layer through the N-type electrode and holes supplied to the light emitting layer through the P-type electrode. The vertical type LED includes a light emitting layer and an N-type electrode and a P-type electrode arranged above and below the light emitting layer. The vertical type LED may also emit light by the combination of electrons and holes supplied from the electrodes, like a lateral type LED. The flip type LED has substantially the same structure as the lateral type LED. However, a flip type LED may be directly attached to a printed circuit board or the like, omitting a medium such as metal wires or connection electrodes. Hereinafter, for convenience of description, it is assumed that a plurality of LEDs ED is a vertical type, but the present disclosure is not limited thereto.

The plurality of LEDs ED may emit light of different colors, or may emit light of the same color. For example, when a plurality of LEDs ED emits light of different colors, an LED ED disposed in a red sub-pixel SPXR among a plurality of sub-pixels SPX is an LED emitting red light, an LED ED disposed in a green sub-pixel SPXG among a plurality of sub-pixels SPX is an LED emitting green light, and an LED ED disposed in a blue sub-pixel SPXB among a plurality of sub-pixels SPX is an LED emitting blue light.

On the other hand, the light emitted from each of the plurality of LEDs ED may be converted into various colors by using light converting means such as the light conversion unit 160 on each of the plurality of LEDs ED. Hereinafter, for convenience of description, it is assumed that all of the plurality of LEDs ED emits blue light, but the present disclosure is not limited thereto.

With reference to FIGS. 2A and 2B, a plurality of LEDs ED includes a first LED 140 and a second LED 150. The first LED 140 is disposed in the red sub-pixel SPXR and the green sub-pixel SPXG among the plurality of sub-pixels SPX. The second LED 150 is disposed in the blue sub-pixel SPXB among the plurality of sub-pixels SPX. The light emitted from the first LED 140 is converted into light of another color and is emitted to the upper side of the first substrate 110, and the light emitted from the second LED 150 may be directly emitted to the upper side of the first substrate 110 because the light conversion unit 160 is not disposed on the upper side of the second LED 150.

The first LED 140 includes a first p-type semiconductor layer 141, a first light emitting layer 142, a first n-type semiconductor layer 143, a first p-type electrode 144, and a first n-type electrode 145.

The first p-type semiconductor layer 141 of the first LED 140 is disposed on the contact electrode 131 of the red sub-pixel SPXR and the green sub-pixel SPXG among the plurality of sub-pixels SPX, and the first n-type semiconductor layer 143 is disposed on the first p-type semiconductor layer 141. The first p-type semiconductor layer 141 and the first n-type semiconductor layer 143 may be a layer formed by implanting n-type or p-type impurity into gallium nitride (GaN). For example, the first p-type semiconductor layer 141 is a layer formed by implanting a p-type impurity into gallium nitride, and the first n-type semiconductor layer 143 is a layer formed by implanting a n-type impurity into gallium nitride, but the present disclosure is not limited thereto. The p-type impurity may be magnesium (Mg), zinc (Zn), beryllium (Be), or the like, and the n-type impurity may be silicon (Si), germanium (Ge), tin (Sn), or the like, but the present disclosure is not limited thereto.

The first light emitting layer 142 is disposed between the first p-type semiconductor layer 141 and the first n-type semiconductor layer 143. The first light emitting layer 142 may emit light by receiving holes and electrons from the first p-type semiconductor layer 141 and the first n-type semiconductor layer 143. The first light emitting layer 142 may be a single layer or a multi-quantum well (MQW) structure, for example, the first light emitting layer 142 may be made of indium gallium nitride (InGaN) or gallium nitride (GaN), or the like, but the present disclosure is not limited thereto.

A first p-type electrode 144 is disposed between the first p-type semiconductor layer 141 and the contact electrode 131. The first p-type electrode 144 may be electrically connected to the first p-type semiconductor layer 141. The first p-type electrode 144 may be in contact with the lower surface of the first p-type semiconductor layer 141 and the lower surface of the first p-type electrode 144 may be in contact with the plurality of contact electrodes 131. Therefore, the plurality of semiconductor elements 120 may be electrically connected to the plurality of first LEDs 140 through a plurality of contact electrodes 131 and a plurality of first p-type electrodes 144. For example, a particular voltage from the plurality of semiconductor elements 120 may be applied to the first p-type semiconductor layer 141 of the plurality of first LEDs 140 through the plurality of contact electrodes 131 and the plurality of first p-type electrodes 144, and electrons or holes may be supplied to the first light emitting layer 142 of each of the plurality of first LEDs 140.

With reference to FIG. 2B, a first n-type electrode 145 is disposed on the first n-type semiconductor layer 143. The first n-type electrode 145 is in contact with the upper surface of the partition PT. Accordingly, the first n-type electrode 145 may be electrically connected to the first n-type semiconductor layer 143.

A partition PT is disposed between the first n-type semiconductor layer 143 and the first n-type electrode 145 of the plurality of first LEDs 140. The partition PT is disposed in contact with the upper surface of the first n-type semiconductor layer 143. The partition PT may be arranged to expose a portion of the upper surface of the first n-type semiconductor layer 143. That is, a groove ILH may be disposed on the upper surface of the plurality of first LEDs 140, and the groove ILH may be a space defined by the plurality of first LEDs 140 and the partition PT. The plurality of first LEDs 140 and the plurality of partitions PT may also be defined as the inorganic light emitting structure IL.

The partition PT may be formed integrally with the first n-type semiconductor layer 143. The partition PT is formed integrally with the first n-type semiconductor layer 143, thereby electrically interconnecting a first n-type electrode 145 in contact with the upper surface of the partition PT and the first n-type semiconductor layer 143 that is formed integrally with the partition PT. Thus, the partition PT may function as the first n-type semiconductor layer 143 of the plurality of first LEDs 140. Alternatively, the partition PT may be formed separate from but in direct contact with the first n-type semiconductor layer 143, thereby electrically interconnecting the first n-type electrode 145 and the first n-type semiconductor layer 143 in contact with the lower surface of the partition PT.

On the other hand, FIG. 2A shows a structure in which a plurality of partitions PT are formed separately from the plurality of first LEDs 140 and an inorganic light emitting structure IL is defined as being formed with a plurality of first LEDs 140 and a plurality of partitions PT. However, the plurality of partitions PT may be defined as being included in the plurality of first LEDs 140, but the present disclosure is not limited thereto.

The second LED 150 includes a second p-type semiconductor layer 151, a second light emitting layer 152, a second n-type semiconductor layer 153, a second p-type electrode 154, and a second n-type electrode 155.

The second p-type semiconductor layer 151 of the second LED 150 is disposed on the contact electrode 131 of the blue sub-pixel SPXB among the plurality of sub-pixels SPX, and the second n-type semiconductor layer 153 is disposed on the second p-type semiconductor layer 151. The second p-type semiconductor layer 151 and the second n-type semiconductor layer 153 may be a layer formed by implanting n-type or p-type impurity into gallium nitride (GaN). For example, the second p-type semiconductor layer 151 is a layer formed by implanting an p-type impurity into gallium nitride, and the second n-type semiconductor layer 153 is a layer formed by implanting an n-type impurity into gallium nitride, but the present disclosure is not limited thereto. The p-type impurity may be magnesium (Mg), zinc (Zn), beryllium (Be), and the n-type impurity may be silicon (Si), germanium (Ge), tin (Sn), but the present disclosure is not limited thereto.

The second light emitting layer 152 is disposed between the second p-type semiconductor layer 151 and the second n-type semiconductor layer 153. The second light emitting layer 152 may emit light by receiving holes and electrons from the second p-type semiconductor layer 151 and the second n-type semiconductor layer 153. The second light emitting layer 152 may be a single layer or a multi-quantum well (MQW) structure. For example, the second light emitting layer 152 may be made of indium gallium nitride (InGaN) or gallium nitride (GaN), but the present disclosure is not limited thereto.

The second p-type electrode 154 is disposed between the second p-type semiconductor layer 151 and the contact electrode 131. The second p-type electrode 154 may be electrically connected to the second p-type semiconductor layer 151. The second p-type electrode 154 may be in contact with the lower surface of the second p-type semiconductor layer 151 and the lower surface of the second p-type electrode 154 may be in contact with the plurality of contact electrodes 131. Therefore, the plurality of semiconductor elements 120 may be electrically connected to the plurality of second LEDs 150 through the plurality of contact electrodes 131 and the plurality of second p-type electrodes 154. For example, a particular voltage from the plurality of semiconductor elements 120 may be applied to the second p-type semiconductor layer 151 of the plurality of second LEDs 150 through the plurality of contact electrodes 131 and the plurality of second p-type electrode 154, and electrons or holes may be supplied to the second light emitting layer 152 of each of the plurality of second LEDs 150.

With reference to FIG. 2B, a second n-type electrode 155 is disposed on the second n-type semiconductor layer 153. The second n-type electrode 155 may be electrically connected to the second n-type semiconductor layer 153. The second n-type electrode 155 may be electrically connected to the second n-type semiconductor layer 153 in contact with the upper surface of the second n-type semiconductor layer 153.

With reference again to FIG. 2A, a common electrode CE is disposed on a plurality of LEDs ED. The common electrode CE may apply a particular voltage to the plurality of LEDs ED. For example, the common electrode CE may supply electrons or holes to the first light emitting layer 142 through the first n-type electrode 145 of the plurality of first LEDs 140. The common electrode CE may supply electrons or holes to the second light emitting layer 152 through the second n-type electrode 155 of the plurality of second LEDs 150. With reference to FIG. 2A, it is illustrated such that the common electrode CE disposed in the respective sub-pixels SPX is connected such that the plurality of first LEDs 140 and the plurality of second LEDs 150 share the common electrode CE electrically or physically. However, the common electrode CE may be separately arranged for the sub-pixels SPX. In order to transmit the light emitted from the first light emitting layer 142 and the second light emitting layer 152, the common electrode CE may be formed of indium tin oxide (ITO), indium zinc oxide (IZO), indium tin zinc oxide (ITZO), zinc oxide (ZnO), and a transparent conductive oxide of a tin oxide (TO) type, but, the present disclosure is not limited thereto.

The common electrode CE may be supplied with a common voltage. For example, the common electrode CE may extend to the non-display area NA and may be connected to a driver IC of the non-display area NA to receive a common voltage or may be connected to a semiconductor element 120 receiving a particular voltage from the driver IC and the like to receive a common voltage.

A plurality of light conversion units 160 is disposed on at least a portion of the LEDs ED among the plurality of LEDs ED. For example, a plurality of the light conversion units 160 may be disposed on the first LED 140 among the plurality of LEDs ED. That is, a plurality of the light conversion units 160 may be disposed on the plurality of inorganic light emitting structures IL including the plurality of first LEDs 140 and the plurality of partitions PT. The plurality of light conversion units 160 may be arranged to fill the groove ILH defined by the plurality of first LEDs 140 and the plurality of partitions PT. The plurality of light conversion units 160 may be disposed to cover the second reflector 172 covering the upper surface of the first n-type semiconductor layer 143 of the plurality of first LEDs 140. In this case, the plurality of partitions PT may be disposed so as to surround the side surfaces of the plurality of light conversion units 160.

The plurality of light conversion units 160 may convert light emitted from the plurality of LEDs ED into light of various colors. Different phosphors may be disposed to each of the plurality of light conversion units 160. The light emitted from the plurality of first LEDs 140 is irradiated to the plurality of light conversion units 160 and the phosphors of the plurality of light conversion units 160 may emit light having a different wavelength spectrum by absorbing a specific light having a specific wavelength spectrum.

For example, the red light conversion unit 160R may be disposed in the red sub-pixel SPXR among the plurality of light conversion units 160. The blue light emitted from the first LED 140 of the red sub-pixel SPXR may be converted into red light through the red light conversion unit 160R. The blue light is a light having a particular wavelength spectrum corresponding to a blue color, and the red light is a light having a particular wavelength spectrum corresponding to a red color.

A green light conversion unit 160G may be disposed in the green sub-pixel SPXG among the plurality of light conversion units 160. The blue light emitted from the first LED 140 of the green sub-pixel SPXG may be converted into green light through the light conversion unit 160G. The green light is a light having a particular wavelength spectrum corresponding to a green color.

At this time, a separate light conversion unit 160 may not be disposed in the blue sub-pixel SPXB. For example, because the second LED 150 disposed in the blue sub-pixel SPXB is a blue LED ED that emits blue light as described above, the blue light emitted from the second LED 150 may be directly emitted to the upper side of the first substrate 110. However, a separate light conversion unit may be disposed on the second LED 150 in order to convert the color of the light emitted from the second LED 150 into light of higher purity color, but the present disclosure is not limited thereto.

A reflector 170 for reflecting the light emitted from the plurality of LEDs ED to the upper side of the first substrate 110 is disposed. The reflector 170 includes a first reflector 171, a second reflector 172, and a third reflector 173.

The first reflector 171 is disposed to surround the outer surfaces of the plurality of the inorganic light emitting structures IL and the plurality of the second LEDs 150. For example, the first reflector 171 is disposed to surround the outer surface of the first LED 140 and the outer surface of the partition PT of the plurality of inorganic light emitting structures IL. The first reflector 171 may be arranged to surround the outer surface of the second LED 150. The first reflector 171 reflects the light emitted to the side of the plurality of LEDs ED among the light emitted from the plurality of LEDs ED to the upper side of the first substrate 110, thereby improving the light efficiency. For example, the first reflector 171 may be formed of an insulating material containing fine particles for reflection of light. For example, the first reflector 171 may be formed of an insulating material of silicon oxide (SiOx) or silicon nitride (SiNx) in which titanium oxide ($TiO_2$) particles are dispersed, but the present disclosure is not limited thereto.

On the other hand, the first reflector 171 may function as an insulating layer for preventing an electrical short circuit between the first p-type semiconductor layer 141 and the first n-type semiconductor layer 143 of the plurality of first LEDs 140, and the second p-type semiconductor layer 151 and the second n-type semiconductor layer 153 of the plurality of second LEDs 150. For example, the first p-type semiconductor layer 141 and the first n-type semiconductor layer 143 of the plurality of first LEDs 140 are electrically connected to different electrodes, thereby supplying electrons and holes to the first light emitting layer 142. The second p-type semiconductor layer 151 and the second n-type semiconductor layer 153 of the plurality of second LEDs 150 are electrically connected to different electrodes, thereby supplying electrons and holes to the second light emitting layer 152. For example, the first p-type semiconductor layer 141 of the plurality of first LEDs 140 may be electrically connected to the first p-type electrode 144, and the first n-type semiconductor layer 143 may be electrically connected to the first n-type electrode 145. The second p-type semiconductor layer 151 of the plurality of second LEDs 150 may be electrically connected to the second p-type electrode 154, and the second n-type semiconductor layer 153 may be electrically connected to the second n-type electrode 155. If the first n-type electrode 145 is brought into contact with not only the first n-type semiconductor layer 143 but also the first p-type semiconductor layer 141, an electrical short circuit may occur. In order to suppress an electrical short circuit between the first p-type semiconductor layer 141 and the first n-type semiconductor layer 143, an insulating layer for insulating the first p-type semiconductor layer 141 and the first n-type semiconductor layer 143 may be additionally formed. In order to suppress a short circuit between the second p-type semiconductor layer 151 and the second n-type semiconductor layer 153, an insulating layer for insulating the second p-type semiconductor layer 151 and the second n-type semiconductor layer 153 may be additionally formed. Further, in the display device 100 according to an embodiment of the present disclosure, the first reflector 171 made of an insulating material may be disposed to surround the outer surfaces of the plurality of LEDs ED. Thus, the first reflector 171 may function as an insulating layer for preventing a short circuit of the plurality of LEDs ED.

The second reflector 172 is disposed on a portion of the plurality of LEDs ED. The second reflector 172 may be disposed on the first LED 140 of the plurality of inorganic light emitting structures IL. For example, the second reflector 172 is disposed between the plurality of first LEDs 140 and the plurality of light conversion units 160, and between the plurality of light conversion units 160 and the plurality of partitions PT. The second reflector 172 is disposed along the inner surface of the plurality of partitions PT and a portion of the upper surface of the first n-type semiconductor layer 143 of the first LED 140 exposed from the plurality of partitions PT. The second reflector 172 reflects the light directed toward the plurality of first LEDs 140 among the lights converted by the plurality of light conversion units 160 to the upper side of the first substrate 110, thereby improving the light extraction efficiency of the first LED 140.

The second reflector 172 transmits the light emitted from the plurality of first LEDs 140 and reflects the light converted by the plurality of the light conversion units 160. The second reflector 172 allows light emitted from the plurality of LEDs ED to pass therethrough and reflects light having a longer wavelength than light emitted from the plurality of LEDs ED. The phosphors included in the plurality of light conversion units 160 are excited by the light emitted from the plurality of first LEDs 140 to emit light having a long wavelength. Therefore, the light converted by the plurality of light conversion units 160 may be a longer wavelength than the light emitted from the plurality of first LEDs 140. In such a case, in order to irradiate the light emitted from the plurality of first LEDs 140 to the plurality of light conversion units 160, the second reflector 172 disposed between the plurality of light conversion units 160 and the plurality of first LEDs 140 may transmit light emitted from the plurality of first LEDs 140. Further, the second reflector 172 reflects the light toward the plurality of first LEDs 140 of the long wavelength light converted by the plurality of light conversion units 160 back to the upper side of the first substrate 110, thereby, the light extraction efficiency of the light converted by the light conversion unit 160 may be improved. Accordingly, the second reflector 172 may transmit the short wavelength light emitted from the plurality of first LEDs 140 and reflect the longer wavelength light than the light emitted from the plurality of first LEDs 140.

The second reflector 172 may be formed by stacking dielectric layers having different refractive indexes. For example, the second reflector 172 may be realized by being formed of alternatively stacked titanium oxide (TiO$_2$) having a larger refractive index and silicon oxide (SiO$_2$) having a smaller refractive index, but the present disclosure is not limited thereto. At this time, the second reflector 172 may selectively transmit and reflect light in a specific wavelength range by adjusting the number of dielectric layers to be stacked and the thickness of the dielectric layer. For example, the second reflector 172 disposed on the first LED 140 that emits blue light may transmit light in a wavelength range corresponding to blue light, and the second reflector 172 may reflect light in a wavelength range corresponding to the green light and the red light.

On the other hand, a portion of the light emitted from the plurality of first LEDs 140 may be emitted to the outside through the upper surface of the plurality of partitions PT without being irradiated to the plurality of light conversion units 160. To be specific, as the second reflector 172 may transmit light emitted from the plurality of first LEDs 140, a portion of the light emitted from the plurality of first LEDs 140 may be emitted through the upper surface of the plurality of partitions PT and the second reflector 172. Although not shown in the drawing, an additional reflector may be provided on the plurality of partitions PT so as to block the light passing through the upper surface of the plurality of partitions PT, which is not converted into a different wavelength by the plurality of light conversion units 160 among light emitted from the plurality of first LEDs 140.

The third reflector 173 may be disposed below the plurality of LEDs ED. For example, the third reflector 173 on the planarization layer 114 may be arranged to overlap the plurality of LEDs ED. For example, the third reflector 173 may be disposed to overlap a portion of the first light emitting layer 142 protruding outward from the plurality of first p-type electrodes 144. The third reflector 173 may be disposed to overlap a portion of the second light emitting layer 152 protruding outward from the plurality of second p-type electrodes 154. The third reflector 173 reflects light emitted to the lower side of the plurality of LEDs ED among the light emitted from the plurality of LEDs ED back to the upper side of the first substrate 110, and the light efficiency of the plurality of LEDs ED may thereby be improved. For example, the third reflector 173 may be made of the same material as the first reflector 171, or may be made of a metal material such as aluminum (Al) or silver (Ag), but the present disclosure is not limited thereto.

The third reflector 173 extends further to the outside of the plurality of LEDs ED and to contact with the common electrode CE. The third reflector 173 may not be floating due to the contact with the common electrode CE. If the third reflector 173 is floated, a coupling electric field may be generated in the third reflector 173 due to the voltage applied to the elements adjacent to the third reflector 173. Accordingly, the parasitic capacitance may be generated and the image quality may be deteriorated. Therefore, by disposing the third reflector 173 in contact with the common electrode CE, the third reflector 173 may not be floated, and parasitic capacitance may be reduced. However, the third reflector 173 may be in contact with the contact electrode 131, the first p-type electrode 144, and/or the second p-type electrode 154 rather than the common electrode CE, but the present disclosure is not limited thereto.

Although the third reflector 173 and the first p-type semiconductor layer 141 and the second p-type semiconductor layer 151 of the plurality of LEDs ED are shown as being separated from each other in FIG. 2A, the first p-type semiconductor layer 141 and the second p-type semiconductor layer 151 may be in contact with the third reflector 173. For example, the thickness of the third reflector 173 may be equal to the sum of the thickness of the first p-type electrode 141 and the thickness of the contact electrode 131. The upper surface of the third reflector 173 may be in contact with the lower surface of the first p-type semiconductor layer 141 and the lower surface of the second p-type semiconductor layer 151. Further, the third reflector 173 may not be limited to the features as shown in FIG. 2A.

In the display device 100 according to an embodiment of the present disclosure, a plurality of light conversion units 160 may be arranged in a groove ILH disposed on a plurality of first LEDs 140. Thus, the thickness of the plurality of light conversion units 160 may be increased and the light conversion efficiency may be improved. For example, a plurality of first LEDs 140 among the plurality of LEDs ED are provided with partitions PT exposing a portion of the upper surface of the plurality of first LEDs 140. Accordingly, a groove ILH may be formed, which is a space defined by a portion of the upper surface of the plurality of first LEDs 140 and a plurality of partitions PT. That is, the groove ILH may be formed on the plurality of inorganic light emitting structures IL including the plurality of first LEDs 140 and the plurality of partitions PT. Further, a plurality of light conversion units 160 may be disposed in the grooves ILH of the plurality of inorganic light emitting structures IL. The thickness of the plurality of light conversion units 160 may be determined by the plurality of partitions PT, and the thickness of the plurality of light conversion units 160 may be easily increased by increasing the height of the plurality of partitions PT. Further, the light emitted from the plurality of first LEDs 140 may be sufficiently absorbed by the plurality of light conversion units 160 and converted into lights of different colors by increasing the thickness of the plurality of light conversion units 160. Further, the plurality of light conversion units 160 may be arranged not to cover the plurality of first LEDs 140, but to fill the grooves ILH on the upper surface of the plurality of first LEDs 140. Therefore, the amount of material consumed for forming the plurality of light conversion units 160 may be reduced. Thus, the display device 100 according to an embodiment of the present disclosure may form a groove ILH in which a plurality of light conversion units 160 are arranged by forming a partition PT integrally formed with a first n-type semiconductor layer 143 of the plurality of first LEDs 140 on the plurality of first LEDs 140. Therefore, the thickness of the plurality of light conversion units 160 may be increased to improve the light conversion efficiency.

The display device 100 according to an embodiment of the present disclosure may improve the light extraction efficiency and the light conversion efficiency of the plurality of LEDs ED by disposing the plurality of reflectors 170 surrounding the plurality of LEDs ED. The plurality of light conversion units 160 may be disposed on the upper surface of the plurality of first LEDs 140 among the plurality of LEDs ED. The first reflector 171 surrounding the outer surface of the plurality of first LEDs 140 and the third reflector 173 disposed below the plurality of first LEDs 140 may reflect light emitted from the plurality of first LEDs 140 to the plurality of light conversion units 160. That is, the light may be reflected to the upper side of the first substrate 110. Therefore, the first reflector 171 and the third reflector 173 are disposed to surround the outer surface and the lower surface of the plurality of first LEDs 140 so as to reflect the light emitted from the plurality of first LEDs 140 toward the light conversion units 160, thereby improving the light conversion efficiency. Further, the light emitted from the plurality of second LEDs 150 may be reflected to the upper side of the first substrate 110 by disposing the first reflector 171 and the third reflector 173, which surround the outer side surface and the lower surface of the plurality of second LEDs 150. Therefore, the light extraction efficiency of the plurality of second LEDs 150 may be improved. Further, the second reflector 172, which transmits the light emitted from the plurality of first LEDs 140 and reflects the light converted by the plurality of the light conversion units 160 to the upper side of the first substrate 110, is disposed between the plurality of first LEDs 140 and the plurality of light conversion units 160. Therefore, it may be possible to reduce and possibly minimize the decrease in the light extraction efficiency due to the re-absorption of the light converted by the plurality of light conversion units 160 into the plurality of first LEDs 140. Accordingly, the display device 100 according to an embodiment of the present disclosure may improve the light extraction efficiency by disposing the first reflector 171 and the third reflector 173 surrounding the plurality of LEDs ED. Further, the second reflector 172 may be disposed between the plurality of first LEDs 140 and the plurality of light conversion units 160. Accordingly, it may be possible to reduce and possibly minimize re-absorption of the light converted by the plurality of light conversion unit 160 into the plurality of first LEDs 140, thereby improving the light extraction efficiency.

Hereinafter, a method of manufacturing the display device 100 and the display device 100 according to an embodiment of the present disclosure will be described in detail with reference to FIGS. 3A to 3M.

Figure 3A:
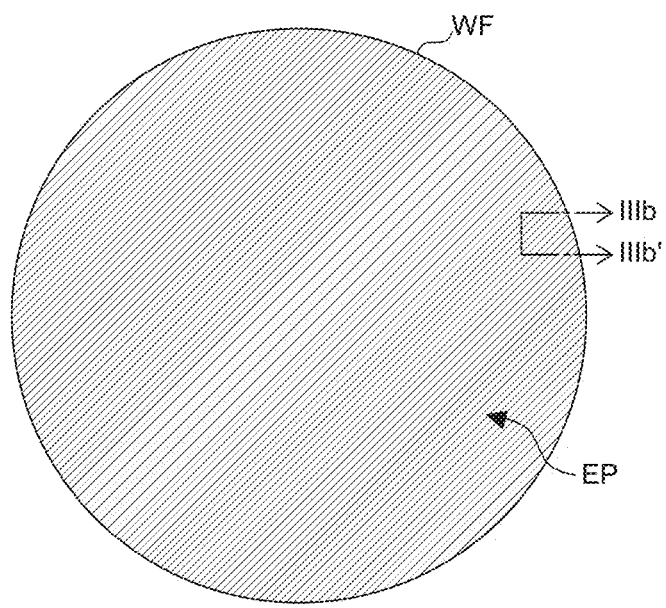
Figure 3B:
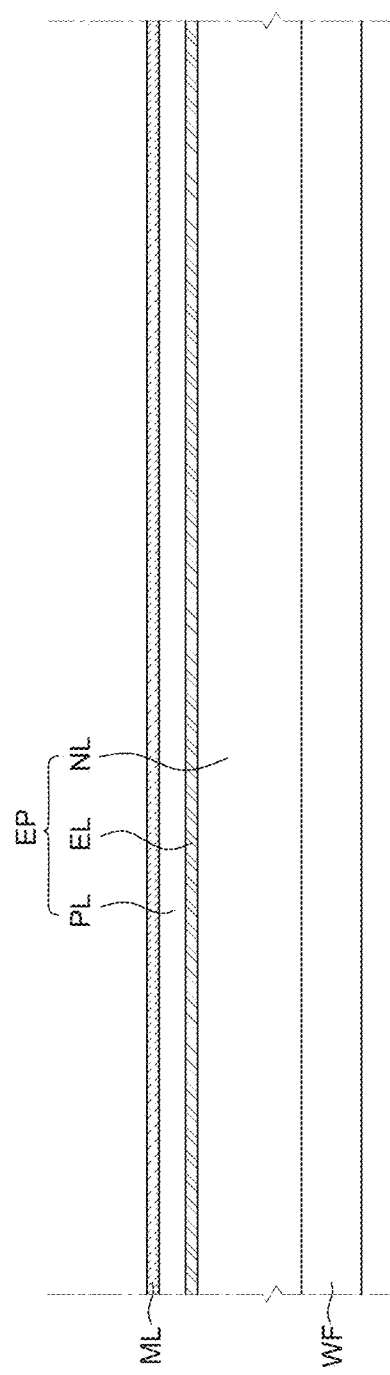
Figure 3D:
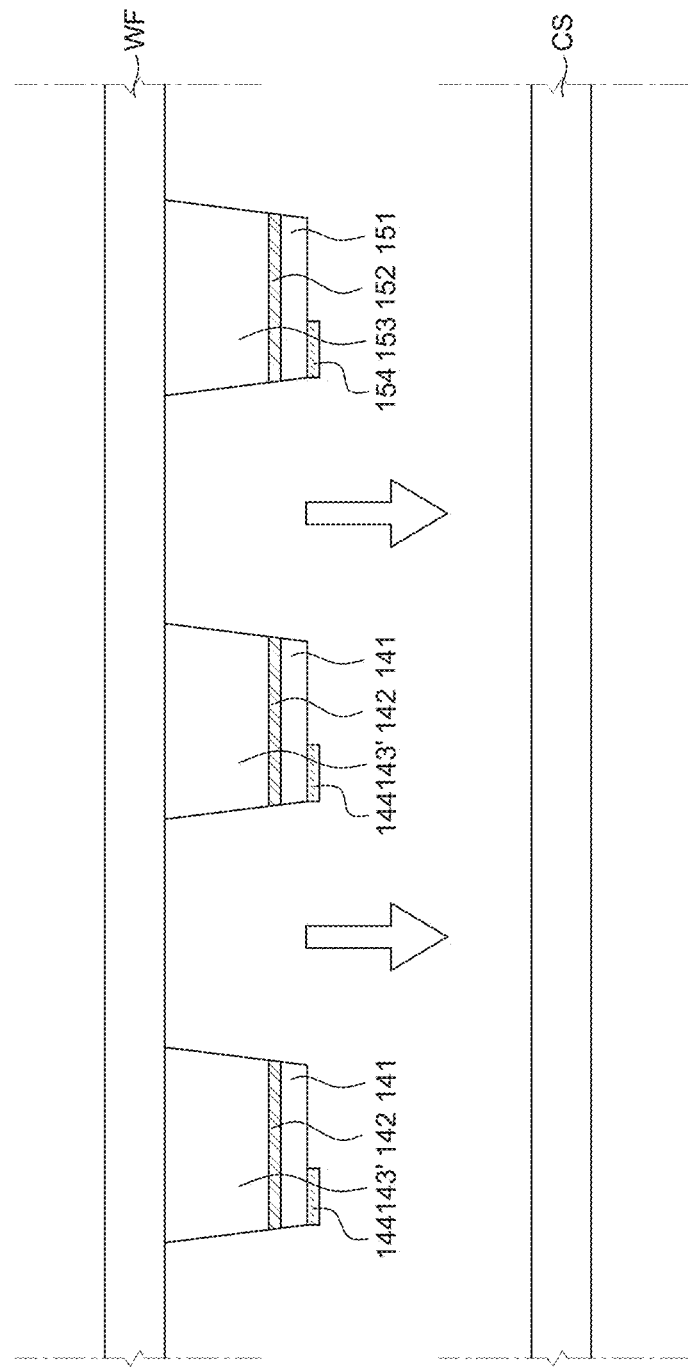
Figure 3E:
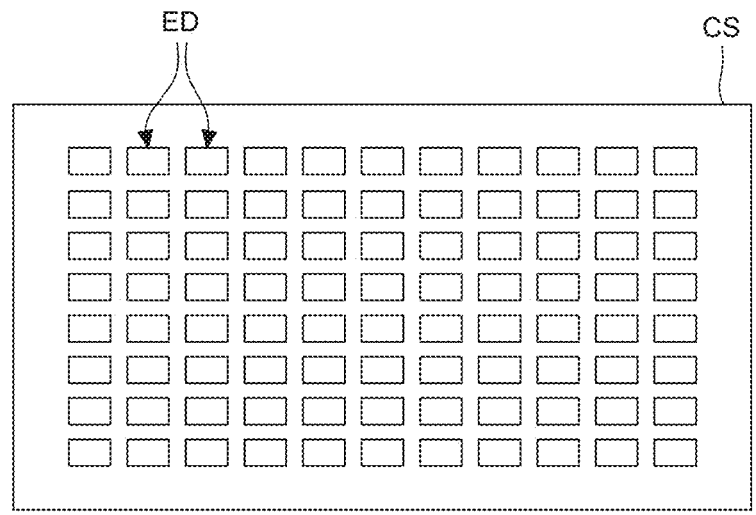
Figure 3F:
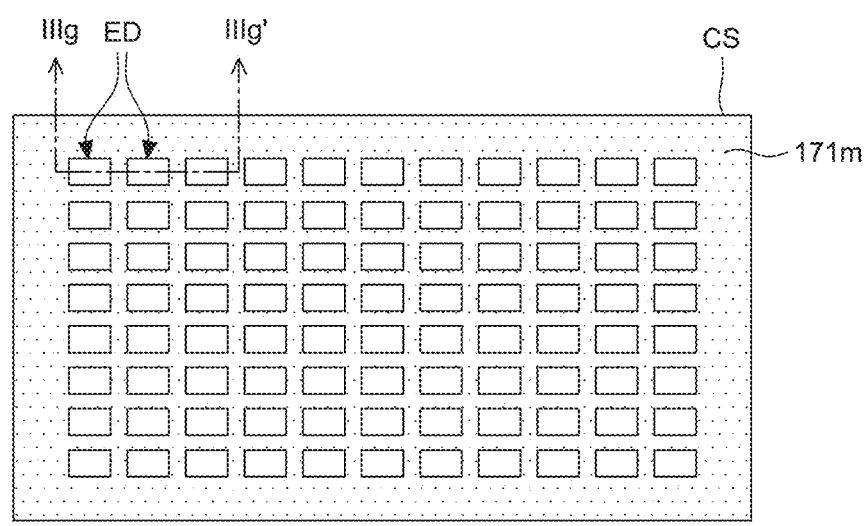
Figure 3G:
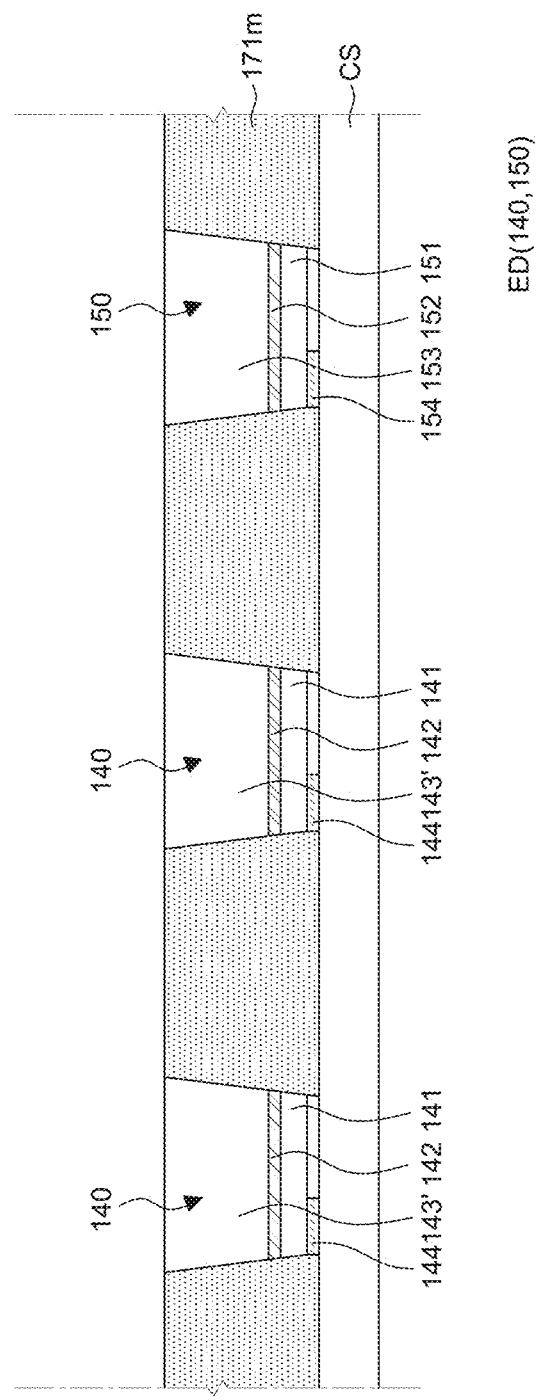
Figure 3H:
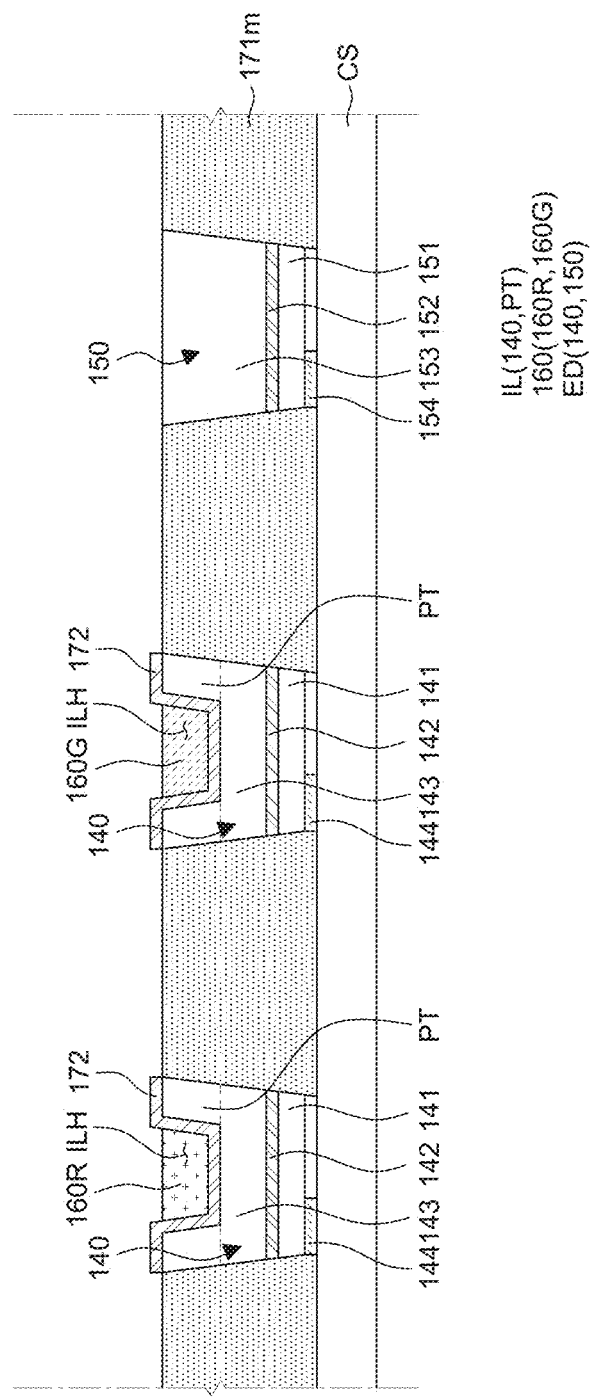
Figure 3I:
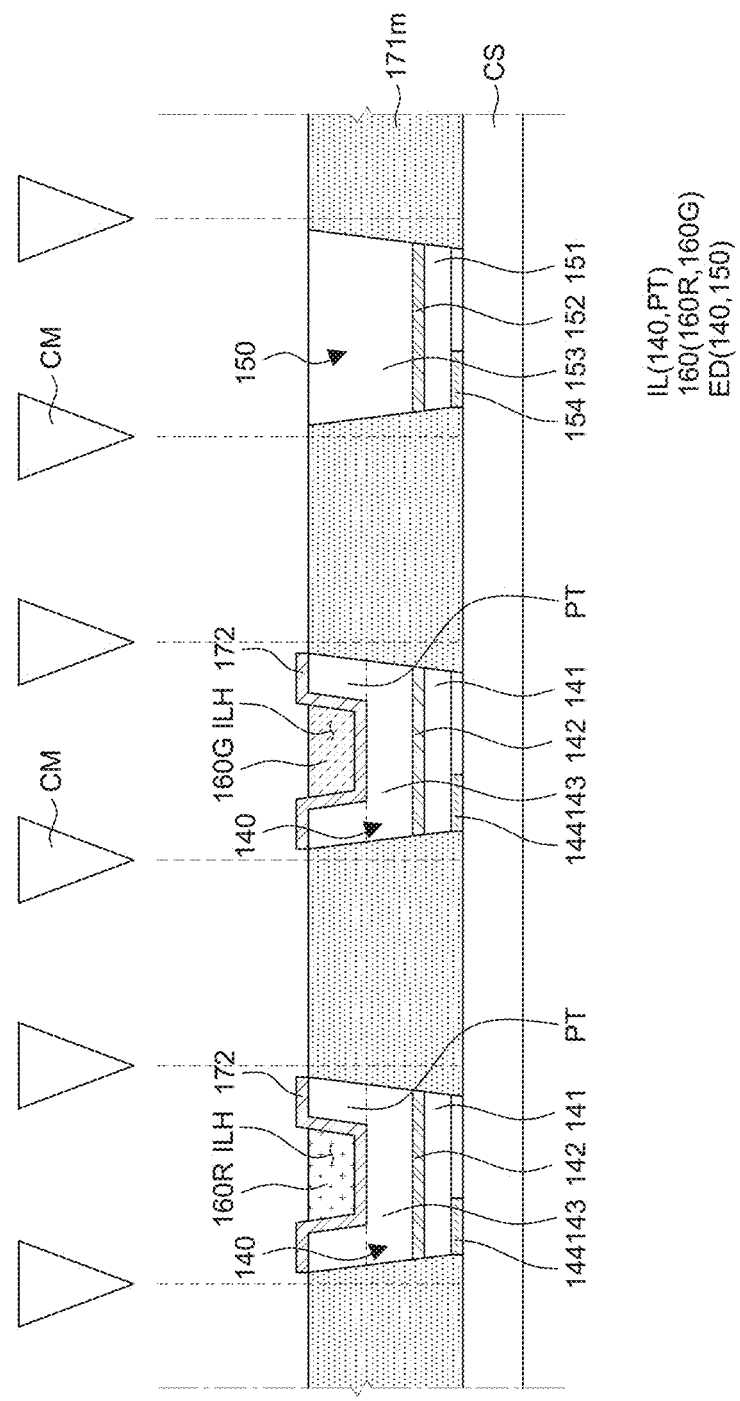
Figure 3J:
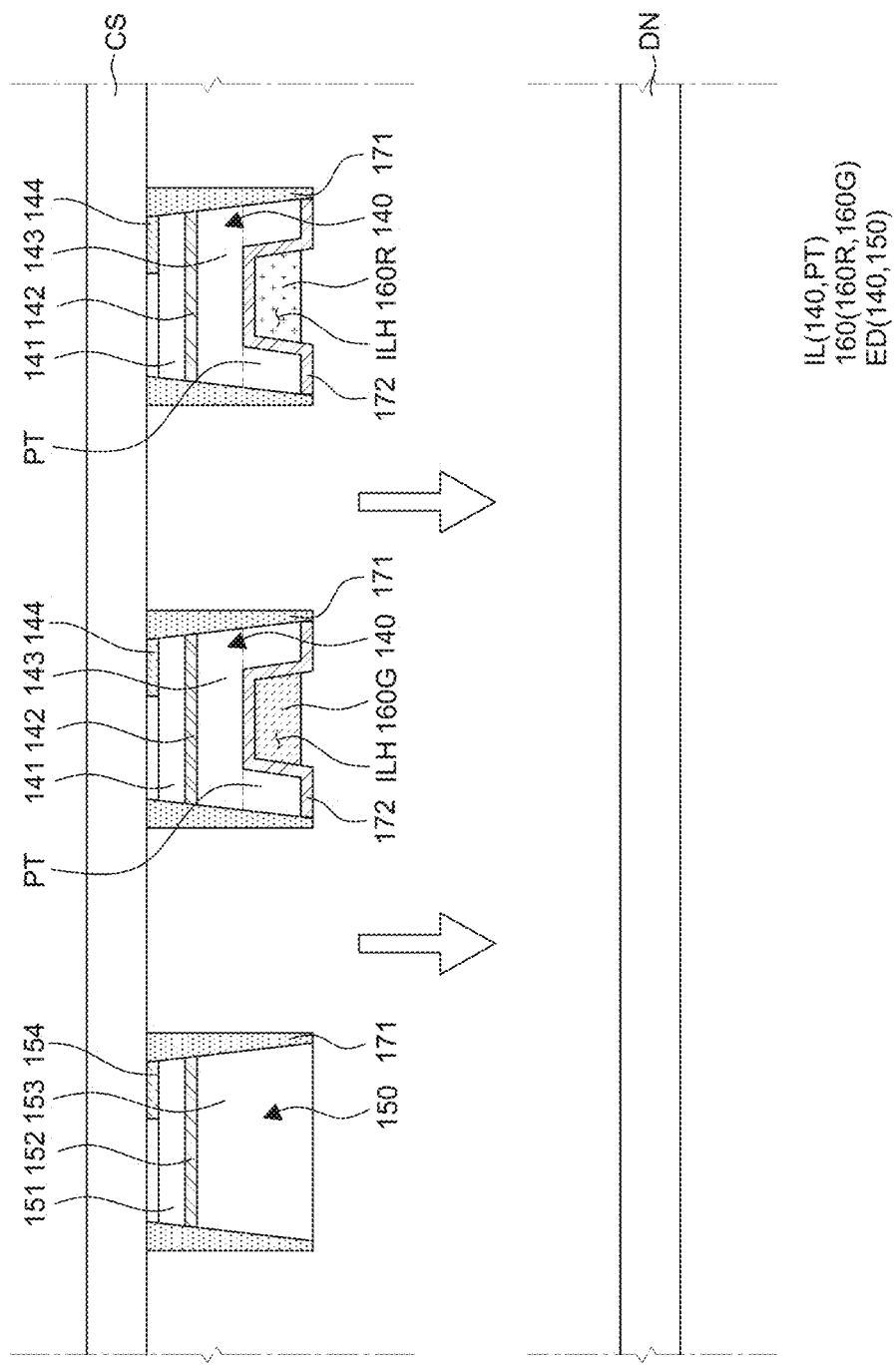
Figure 3K:
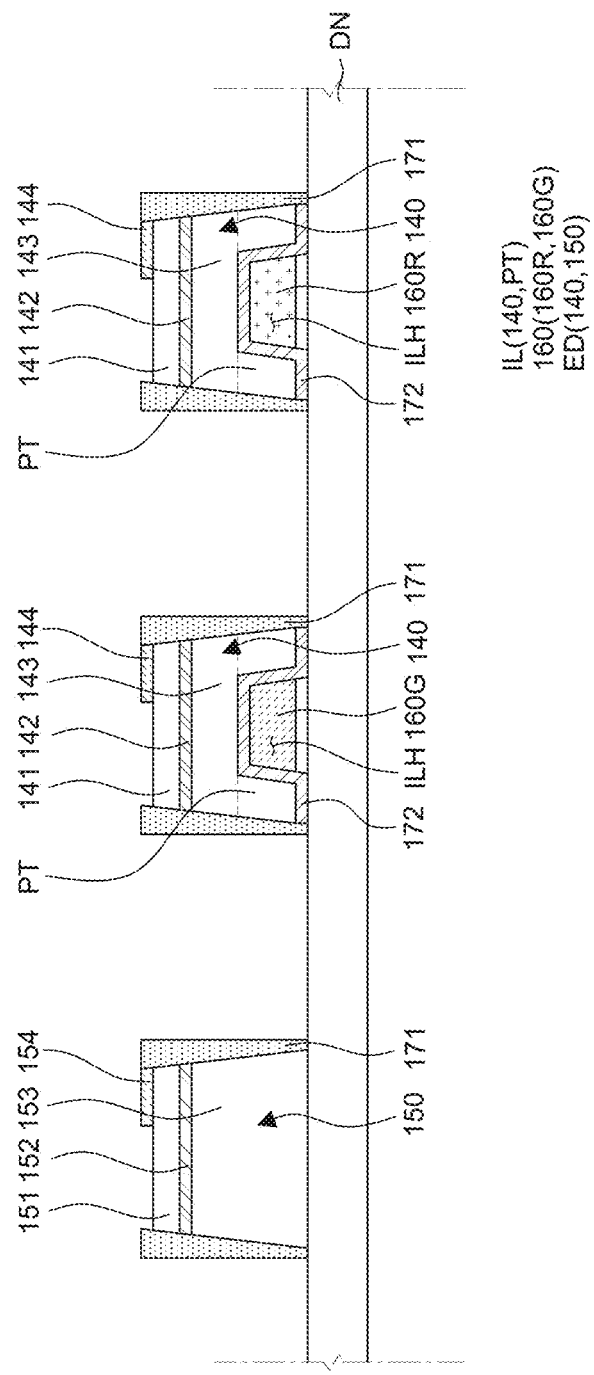
Figure 3L:
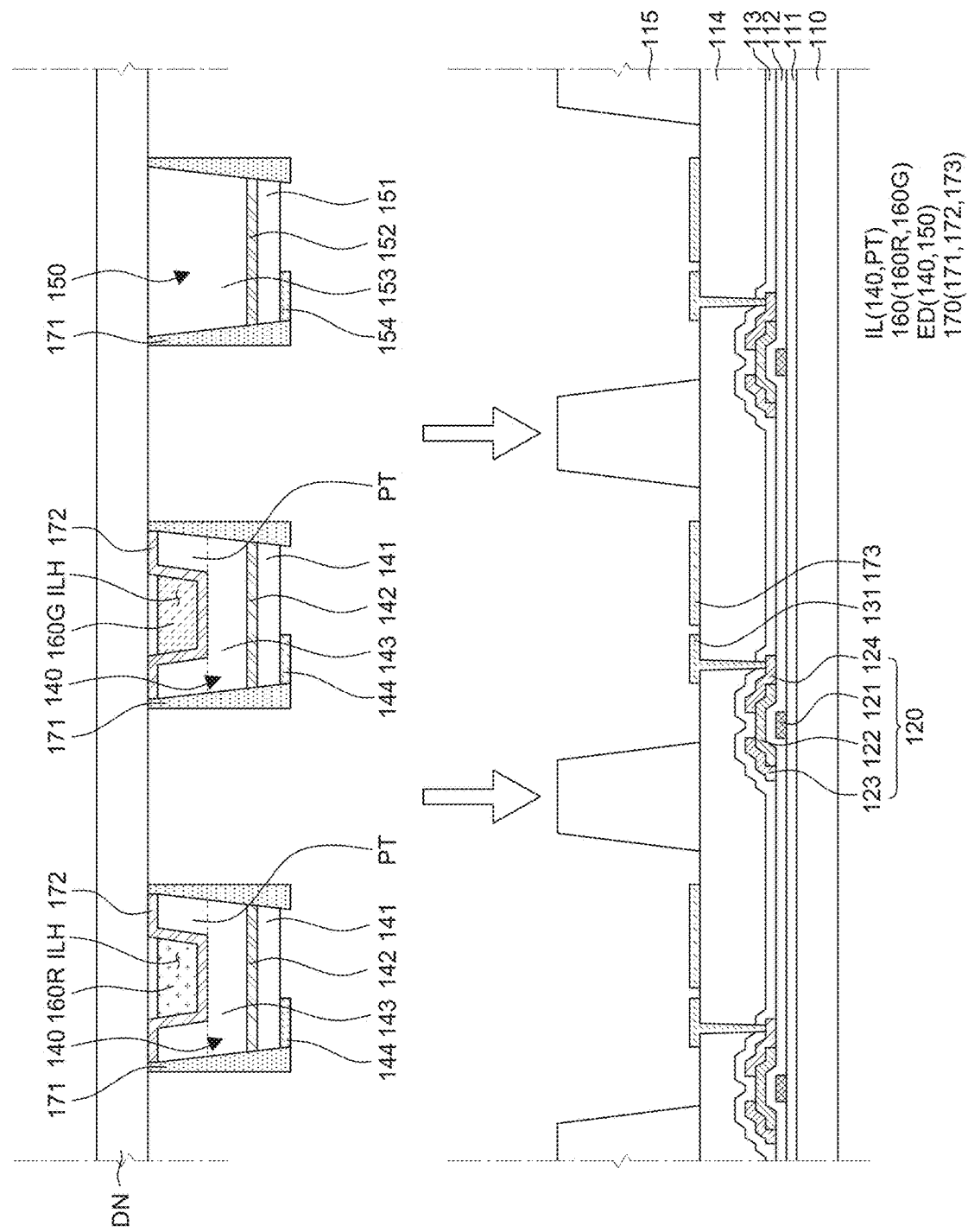
Figure 3M:
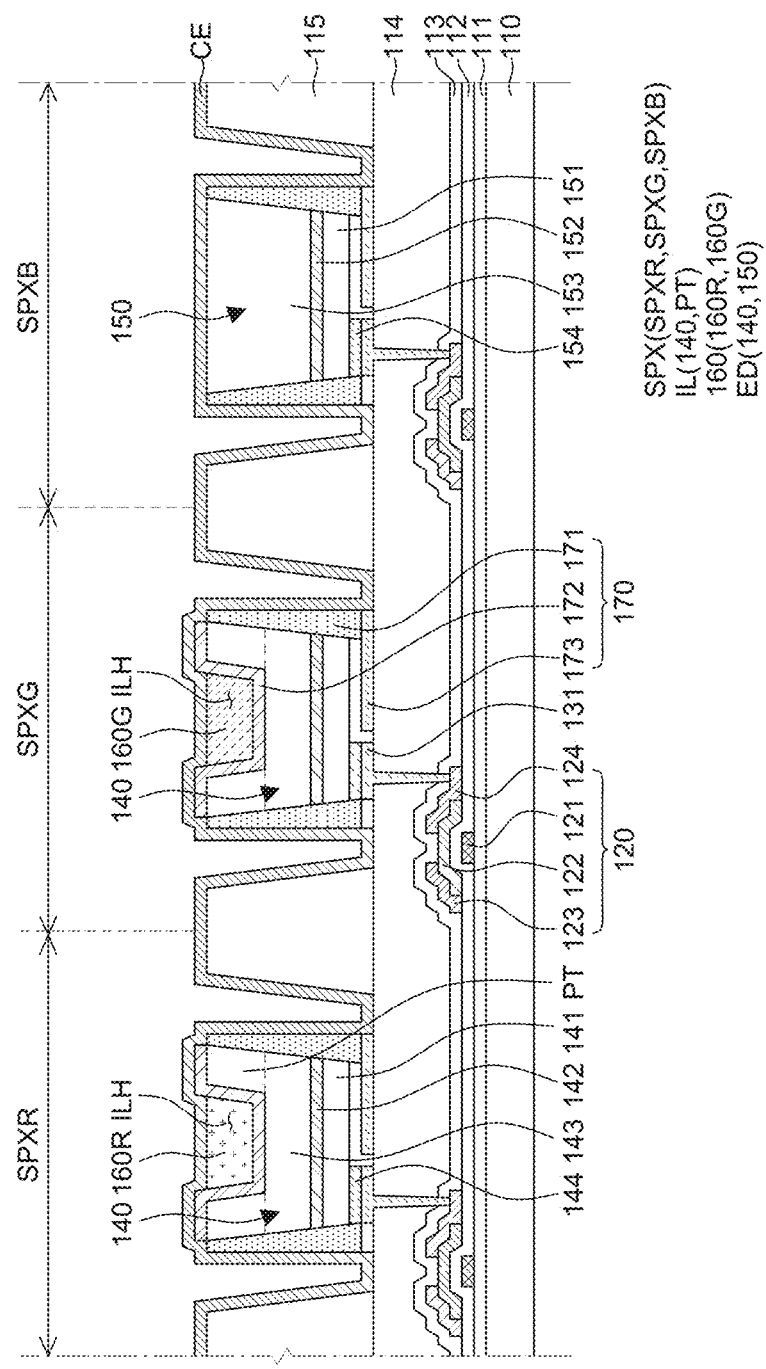

FIGS. 3A to 3M are schematic process diagrams illustrating a method of manufacturing a display device and a display device according to an embodiment of the present disclosure. For example, FIG. 3A is a schematic plan view of a second substrate WF having an epi layer EP formed thereon. FIG. 3B is a cross-sectional view taken along line IIIb-IIIb' in FIG. 3A. FIG. 3C is a schematic cross-sectional view for explaining the processing of the epi layer EP. FIGS. 3D and 3E are schematic cross-sectional and schematic plan view views, respectively, for explaining a process of transferring a plurality of LEDs ED to a first auxiliary substrate CS. FIGS. 3F and 3G are schematic plan and schematic cross-sectional views, respectively, for explaining the process of forming the reflective layer 171m between the plurality of LEDs ED. FIG. 3H is a schematic cross-sectional view for explaining a process of forming a plurality of second reflectors 172 and a plurality of light conversion units 160. FIG. 3I is a schematic cross-sectional view for explaining a process of forming the first reflector 171. FIGS. 3J and 3K are schematic cross-sectional views for explaining the process of transferring a plurality of LEDs ED to the second auxiliary substrate DN. FIG. 3L is a schematic cross-sectional view illustrating a process of transferring a plurality of LEDs ED to the first substrate 110. FIG. 3M is a schematic cross-sectional view for explaining the process of forming the common electrode CE.

With reference to FIGS. 3A and 3B, an epi layer EP is formed on the overall surface of the second substrate WF. The second substrate WF is a substrate on which the epi layer EP is grown. The second substrate WF may be formed of, for example, sapphire, silicon carbide (SiC), gallium nitride (GaN), zinc oxide (ZnO), or the like, but present disclosure is not limited thereto. The second substrate WF may also be referred to as a wafer.

The epi layer EP is for forming a plurality of LEDs ED, and may have a structure in which a plurality of layers of the LEDs ED are sequentially stacked. For example, the epi layer EP may be composed of an n-type semiconductor material layer NL, a light emitting material layer EL, and a p-type semiconductor material layer PL.

First, an n-type semiconductor material layer NL is formed on the overall surface of the second substrate WF. The n-type semiconductor material layer NL includes a first n-type semiconductor layer 143 of the plurality of first LEDs 140 and a second n-type semiconductor layer 153 of the plurality of second LEDs 150. For example, the n-type semiconductor material layer NL may be formed of gallium nitride doped with an n-type impurity.

The thickness of the n-type semiconductor material layer NL may be determined in consideration of the thickness of the plurality of light conversion units 160 to be formed and the depth of the groove ILH. For example, the first n-type semiconductor layer 143 and the plurality of partitions PT of the plurality of first LEDs 140 may be formed together from the n-type semiconductor material layer NL, and the n-type semiconductor material layer NL may be thickened to form the grooves ILH. Further explanation will be described in detail with reference to FIG. 3H.

Subsequently, a light emitting material layer EL is formed on the n-type semiconductor material layer NL. The light emitting material layer EL is a material forming the first light emitting layer 142 of the plurality of first LEDs 140 and the second light emitting layer 152 of the plurality of second LEDs 150. For example, the light emitting material layer EL may be made of indium gallium nitride, gallium nitride, or the like.

Further, a p-type semiconductor material layer PL is formed on the light emitting material layer EL. The p-type semiconductor material layer PL is a material forming the first p-type semiconductor layer 141 of the plurality of first LEDs 140 and the second p-type semiconductor layer 151 of the plurality of second LEDs 150. For example, the p-type semiconductor material layer PL may be composed of gallium nitride doped with a p-type impurity.

Then, a metal layer ML is formed on the p-type semiconductor material layer PL. The metal layer ML may be a material forming the first p-type electrode 144 of the plurality of first LEDs 140 and the second p-type electrode 154 of the plurality of second LEDs 150. For example, the metal layer ML may be made of a conductive material.

With reference to FIG. 3C, a plurality of LEDs ED is formed by processing an epi layer EP and a metal layer ML formed on the overall surface of the second substrate WF. For example, a plurality of first p-type electrodes 144 and a plurality of second p-type electrodes 154 may be formed by etching a metal layer ML.

Next, a first p-type semiconductor layer 141 of the plurality of first LEDs 140, a first light emitting layer 142, and an initial first n-type semiconductor layer 143' may be formed by sequentially etching a p-type semiconductor material layer PL of an epi layer EP exposed from a plurality of first p-type electrodes 144 and a plurality of second p-type electrodes 154, a light emitting material layer EL, and a n-type semiconductor material layer NL. A second p-type semiconductor layer 151 of the plurality of second LEDs 150, a second light emitting layer 152, and a second n-type semiconductor layer 153 may be formed by sequentially etching a p-type semiconductor material layer PL of an epi layer EP exposed from a plurality of first p-type electrodes 144 and a plurality of second p-type electrodes 154, a light emitting material layer EL, and a n-type semiconductor material layer NL. Accordingly, forming of the first p-type semiconductor layer 141 of a plurality of first LEDs 140, the first light emitting layer 142, the initial first n-type semiconductor layer 143', the first p-type electrode 144, the second p-type semiconductor layer 151 of the plurality of second LEDs 150, the second light emitting layer 152, the second n-type semiconductor layer 153 and the second p-type electrode 154 may be completed.

Meanwhile, the initial first n-type semiconductor layer 143' of the plurality of first LEDs 140 is in a state before a plurality of partitions PT and grooves ILH are formed. Thus, the initial n-type semiconductor layer 143' may be the first n-type semiconductor layer 143 by forming a plurality of partitions PT.

Meanwhile, with reference to FIGS. 3A and 3B, an n-type semiconductor material layer NL, a light emitting material layer EL, and a p-type semiconductor material layer PL are sequentially formed on a second substrate WF. However, a p-type semiconductor material layer PL may be first formed on the overall surface of the second substrate WF, and then a light emitting material layer EL and an n-type semiconductor material layer NL may be sequentially formed on the p-type semiconductor material layer PL, but the present disclosure is not limited thereto.

Next, with reference to FIGS. 3D and 3E, a plurality of first LEDs 140 and a plurality of second LEDs 150 on a second substrate WF are transferred to a first auxiliary substrate CS.

A plurality of LEDs ED may be arranged so that a first p-type electrode 144 of a plurality of first LEDs 140 and a second p-type electrode 154 of a plurality of second LEDs 150 are in contact with an upper surface of the first auxiliary substrate CS. That is, the first p-type electrode 144 of the plurality of first LEDs 140 and the second p-type electrode 154 of the plurality of second LEDs 150 may be bonded to the upper surface of the first auxiliary substrate CS by disposing the second substrate WF on the first auxiliary substrate CS such that the first auxiliary substrate CS and the second substrate WF face each other.

A plurality of LEDs ED may be disposed on the first auxiliary substrate CS and then the second substrate WF may be peeled off from the plurality of LEDs ED. For example, the second substrate WF may be peeled off through a laser lift off (LLO) technique.

In the case of the laser lift off technique, when the laser is irradiated on the second substrate WF, laser absorption occurs at the interface between the plurality of LEDs ED and the second substrate WF. Thus, the plurality of LEDs ED and the second substrate WF may be separated. However, the second substrate WF may be separated by methods other than the laser lift-off method, but the present disclosure is not limited thereto.

Meanwhile, the initial first n-type semiconductor layer 143' of the plurality of first LEDs 140 and the second n-type semiconductor layer 153 of the plurality of second LEDs 150 transferred to the first auxiliary substrate CS may be disposed on the uppermost side in the first auxiliary substrate CS. Further, after being transferred to the first auxiliary substrate CS, the first n-type electrode 145 and the second n-type electrode 155, which are in contact with the upper surface of the initial first n-type semiconductor layer 143' and the upper surface of the second n-type semiconductor layer 153 may be formed. In addition, the first n-type electrode 145 and the second n-type electrode 155 may be formed before or after the transfer to the first auxiliary substrate CS. However, the present disclosure is not limited thereto.

Therefore, after the plurality of LEDs ED is disposed on the first auxiliary substrate CS, the second substrate WF is peeled from the plurality of LEDs ED to complete the transfer of the plurality of LEDs ED.

Next, with reference to FIGS. 3F and 3G, a reflective layer 171m is formed between the plurality of first LEDs 140 and the plurality of second LEDs 150 transferred to the first auxiliary substrate CS. The reflective layer 171m may be formed to fill a space between the plurality of first LEDs 140 and the plurality of second LEDs 150. The reflective layer 171m may be formed to surround outer surfaces of the plurality of first LEDs 140 and the plurality of second LEDs 150. The reflective layer 171m may be formed of an insulating material including fine particles for reflecting light. For example, the reflective layer 171m may be formed of the same material as the first reflector 171, but the present disclosure is not limited thereto.

Next, with reference to FIG. 3H, a plurality of partitions PT, a plurality of second reflectors 172, and a plurality of light conversion units 160 are formed on a plurality of first LEDs 140 among the plurality of LEDs ED.

First, a groove ILH may be formed on the upper surface of the plurality of first LEDs 140 among the plurality of LEDs ED. The first n-type semiconductor layer 143 and the plurality of partitions PT may be formed by forming a groove ILH on the upper surface of the initial first n-type semiconductor layer 143' of the plurality of first LEDs 140. Therefore, forming of the plurality of inorganic light emitting structures IL composed of the plurality of first LEDs 140 and the plurality of partitions PT may be completed.

At this time, the size of the groove ILH may be determined in consideration of the size of the first n-type electrode 145 formed on the upper surface of the first n-type semiconductor layer 143 of the plurality of first LEDs 140. When the groove ILH is formed to be large, the size of the plurality of light conversion units 160 is also increased, and the light conversion efficiency may be improved. However, if the size of the groove ILH is formed large, the first n-type electrode 145 may need to be formed to be small in size, such that current spreading characteristics and ohmic contact characteristics may be degraded and the driving voltage may be increased.

For example, if the voltage from the first n-type electrode 145 is uniformly provided throughout the first n-type semiconductor layer 143, the light may be uniformly emitted in the entire region of the first light emitting layer 142. However, when the size of the first n-type electrode 145 becomes small so that the contact area of the first n-type electrode 145 and the first n-type semiconductor layer 143 becomes small, the voltage from the first n-type electrode 145 may be difficult to uniformly be provided to the first n-type semiconductor layer 143, which may lead to a decrease in efficiency of the plurality of the first LEDs 140. Also, when the size of the groove ILH becomes large and the size of the first n-type electrode 145 becomes small, the ohmic contact characteristics are deteriorated. Thus, the contact resistance between the first n-type electrode 145 and the first n-type semiconductor layer 143 increases, and the carrier injection efficiency is lowered. Hence, the luminous efficiency of the plurality of first LEDs 140 may be reduced due to an increase in heat loss at the interface. Accordingly, the size of the first n-type electrode 145 and the size of the groove ILH may be determined in consideration of current spreading characteristics and ohmic contact characteristics.

On the other hand, a forming position of the groove ILH may be determined in consideration of the tolerance of the photolithography process. When the groove ILH is formed on the upper surface of the first n-type semiconductor layer 143 by the photolithography process, the forming position of the groove ILH from the edge of the first n-type semiconductor layer 143 to the inside may be considered according to the tolerance of the photolithography process. For example, when the tolerance of the photolithography process is about 3 μm, the groove ILH may be designed to be formed inside 3 μm away from the edge of the upper surface of the first n-type semiconductor layer 143.

The depth of the groove ILH may be determined in consideration of the light absorption rate of the phosphor of the plurality of light conversion units 160. For example, the thickness of the plurality of light conversion units 160 formed to fill the grooves ILH of the first LEDs 140 may be determined by the depth of the groove ILH or the height of the partition PT. At this time, light emitted from the plurality of first LEDs 140 is irradiated to the plurality of light conversion units 160, and the phosphors of the plurality of light conversion units 160 may absorb light emitted from the plurality of first LEDs 140 and emit light of a different wavelength. If the depth of the groove ILH, the height of the partition PT or the thickness of the plurality of light conversion units 160 is made small, the phosphors of the plurality of light conversion units 160 may have difficulty in sufficiently absorbing the light emitted from the plurality of first LEDs 140. Thus, the light conversion efficiency of the plurality of light conversion units 160 may be reduced.

On the other hand, as the depth of the groove ILH, the height of the partition PT or the thickness of the plurality of the light conversion units 160 are increased, the phosphors of the plurality of light conversion units 160 may sufficiently absorb the light emitted from the plurality of first LEDs 140. Thus, the light conversion efficiency of the plurality of light conversion units 160 may be improved. However, when the depth of the groove ILH and the depths of the plurality of light conversion units 160 are formed deep, the n-type semiconductor material layer NL may need to be grown thick on the second substrate WF. Because the growth time and cost are increased in order to increase the thickness of the n-type semiconductor material layer NL, the thickness of the n-type semiconductor material layer NL may be determined in consideration of these factors. For example, an n-type semiconductor material layer NL may be grown to a thickness of about 1.5 μm to 2 μm for current spreading characteristics and the like. On the other hand, in the display device 100 according to an embodiment of the present disclosure, the n-type semiconductor material layer NL may be formed to a thickness of about 3 μm to 5 μm or more than 5 μm so that the light conversion efficiency of the plurality of light conversion units 160 may be achieved. Thus, the depth of the groove ILH may be designed in consideration of the light absorptivity of the phosphor of the plurality of light conversion units 160, the growth time and cost of the n-type semiconductor material layer NL, and the like.

Next, a plurality of second reflectors 172 may be formed to cover the upper surface of the plurality of first n-type semiconductor layers 143 and the plurality of partitions PT. The plurality of second reflectors 172 may be formed along the groove ILH defined by the upper surface of the plurality of first n-type semiconductor layers 143 and the plurality of partitions PT. The plurality of second reflectors 172 may be formed along a portion of the upper surface of the first n-type semiconductor layer 143 exposed from the plurality of partitions PT and an inner surface of the plurality of partitions PT. The plurality of second reflectors 172 may be a distributed Bragg reflector formed by stacking dielectric layers having different refractive indexes and may be formed by alternately stacking titanium oxide ($TiO_2$) and silicon oxide ($SiO_2$). However, the present disclosure is not limited thereto.

Then, a plurality of light conversion units 160 may be formed to fill the grooves ILH on the plurality of first LEDs 140. For example, a plurality of the light conversion units 160 may be formed so as to cover the second reflector 172 formed along the groove ILH defined by the plurality of first LEDs 140 and the plurality of partitions PT. Each red light conversion unit 160R and each green light conversion unit 160G may be formed on the plurality of first LEDs 140. The plurality of light conversion units 160 may be formed by an inkjet printing method or a reverse offset printing method, but the present disclosure is not limited thereto.

On the other hand, with reference to FIGS. 3A to 3H, it is described that the n-type semiconductor material layer NL is first formed on the second substrate WF to form a plurality of LEDs ED, and after that the plurality of LEDs ED are transferred to the first auxiliary substrate CS. Thus, the initial first n-type semiconductor layer 143' may be disposed on the uppermost side in the first auxiliary substrate CS and the initial first n-type semiconductor layer 143' disposed on the uppermost side of the first auxiliary substrate CS is processed to form the groove ILH and the plurality of light conversion units 160.

On the other hand, the plurality of LEDs ED formed in the initial first n-type semiconductor layer 143' are arranged on the uppermost side when the epi layer EP is formed on the second substrate WF in the order of the p-type semiconductor material layer PL, the light emitting material layer EL, and the n-type semiconductor material layer NL. Therefore, it may not be necessary to transfer a plurality of LEDs ED formed on the second substrate WF to the first auxiliary substrate CS, but the groove ILH and the light conversion unit 160 may be directly formed on the initial first n-type semiconductor layer 143' disposed on the uppermost side of the second substrate WF. Accordingly, the process of transferring a plurality of LEDs ED to the first auxiliary substrate CS may be omitted according to the order of forming the n-type semiconductor material layer NL or the p-type semiconductor material layer PL on the second substrate WF, but the present disclosure is not limited thereto.

Next, with reference to FIG. 3I, the reflective layer 171*m* between the plurality of LEDs ED is cut to separate each of the plurality of LEDs ED, thereby forming the first reflector 171.

First, the reflective layer 171m between the plurality of LEDs ED may be cut to separate each of the plurality of LEDs ED. For example, the reflective layer 171m between the plurality of LEDs ED may be cut using a cutting member CM or the like. For example, the reflective layer 171m may be cut with a knife or the like, but the present disclosure is not limited thereto.

At this time, the first reflector 171 of the outer surface of the plurality of LEDs ED may be formed by cutting the reflective layer 171m between the plurality of LEDs ED. For example, the reflective layer 171m between the plurality of LEDs ED is cut, thereby it is possible to form the first reflector 171 surrounding the outer surface of the plurality of first LEDs 140, the outer surface of the plurality of partitions PT, and the outer surface of the plurality of second LEDs 150.

Therefore, by cutting the reflective layer 171m, it may be possible to separate each of the plurality of LEDs ED integrally fixed by the reflective layer 171m. Also, the plurality of LEDs ED and the first reflector 171 may be integrally formed, and thereby the plurality of LEDs ED and the first reflector 171 may be easily transferred to the second auxiliary substrate DN and the first substrate 110.

Next, with reference to FIGS. 3J and 3K, a plurality of LEDs ED is transferred to the second auxiliary substrate DN.

The first p-type electrodes 144 of the plurality of first LEDs 140 and the second p-type electrode 154 of the second LED 150 may be disposed on the second auxiliary substrate DN by transferring the plurality of first LEDs 140 and the plurality of second LEDs 150 to the second auxiliary substrate DN for arranging an electrical connection of the first p-type electrode 144 of the plurality of first LEDs 140 and the second p-type electrode 154 of the plurality of second LEDs 150 to the plurality of contact electrodes 131 on the first substrate 110. The first auxiliary substrate CS is arranged on the second auxiliary substrate DN so that the first n-type semiconductor layer 143 of the plurality of first LEDs 140 and the second n-type semiconductor layer 153 of the plurality of second LEDs 150 are facing the upper surface of the second auxiliary substrate DN, and thereby the plurality of first LEDs 140 and the plurality of second LEDs 150 may be transferred to the second auxiliary substrate DN. The second auxiliary substrate DN may be referred to as a donor.

Next, with reference to FIG. 3L, a plurality of first LEDs 140 and a plurality of second LEDs 150 are transferred to a first substrate 110 on which a plurality of semiconductor elements 120 are formed.

The first substrate 110 on which the plurality of semiconductor elements 120 are formed is substantially the same as the display device 100 shown in FIG. 2A. For example, a buffer layer 111, an active layer 122, a gate insulating layer 112, a gate electrode 121, a source electrode 123, and a drain electrode 124 are sequentially formed on a first substrate 110, and then a passivation layer 113 and a planarization layer 114 may be formed. Next, a contact hole may be formed in the planarization layer 114 and the passivation layer 113 to expose the drain electrode 124, and then the contact electrode 131 may be formed on the planarization layer 114 to fill the contact hole. When the contact electrode 131 is formed, a third reflector 173 may be formed on the planarization layer 114 at the same time. Alternatively, the third reflector 173 may be formed on the planarization layer 114 after the contact electrode 131 is formed. Lastly, a bank 115 for exposing the contact electrode 131 and the third reflector 173 may be formed on the planarization layer 114.

A plurality of LEDs ED of the second auxiliary substrate DN are transferred onto the first substrate 110 to electrically connect the plurality of LEDs ED to the plurality of semiconductor elements 120. For example, the first substrate 110 and the second auxiliary substrate DN may be aligned and arranged so that a plurality of contact electrodes 131 of a first substrate 110 is facing a first p-type electrode 144 of a plurality of first LEDs 140 and a second p-type electrode 154 of a plurality of second LEDs 150 of a second auxiliary substrate DN. Then, using a thermocompression method at a high temperature or a laser, the first p-type electrode 144 of the plurality of first LEDs 140 and the second p-type electrode 154 of the plurality of second LEDs 150 may be attached to the contact electrode 131 so that a plurality of LEDs ED may be electrically connected to the plurality of semiconductor elements 120. At this time, the first substrate 110 on which the plurality of semiconductor elements 120 are formed may be referred to as a backplane substrate.

Next, with reference to FIG. 3M, a common electrode CE is formed on the plurality of LEDs ED. The common electrode CE may be formed on the plurality of LEDs ED after electrically connecting the plurality of LEDs ED to the plurality of semiconductor elements 120. For example, the common electrode CE may be formed on the overall upper surface of the first substrate 110 including the plurality of LEDs ED and the banks 115. Further, the common electrode CE may be formed so as to contact each of the first n-type electrode 145 of the plurality of first LEDs 140 and each of the second n-type electrode 155 of the plurality of second LEDs 150. At this time, although not shown in the drawings, the common electrode CE may be disposed up to the non-display area NA and supplied with a voltage from a driver IC or the like arranged in the non-display area NA.

When forming a plurality of LEDs according to a method of manufacturing a display device 100 according to an embodiment of the present disclosure, a plurality of LEDs ED, a plurality of light conversion units 160, a plurality of first reflectors 171, and a plurality of second reflectors 172 are integrated so that it may be transferred to the first substrate 110 on which the plurality of semiconductor elements 120 are formed.

Typically, a plurality of LEDs is transferred onto a backplane substrate on which a plurality of semiconductor elements is formed, and then a material comprising a phosphor on a plurality of LEDs—for example, a photoresist containing a phosphor—is applied to form a light conversion unit. However, it may be difficult to form a light conversion unit having a sufficient thickness in one step, and the photoresist is applied several times. Moreover, a large amount of material may be consumed to apply the photoresist to the front surface of the display device several times.

According to the manufacturing method of the display device 100 according to an embodiment of the present disclosure, a plurality of light conversion units 160 having high light conversion efficiency may be formed by adjusting the depth of the groove ILH formed on the upper surface of the initial first n-type semiconductor layer 143'. An epi layer EP containing an n-type semiconductor material layer NL is grown on the second substrate WF. In this case, the thickness of the n-type semiconductor material layer NL may be increased in consideration of the thickness of the plurality of light conversion units 160. The plurality of LEDs ED may be formed by processing the epi layer EP, and the plurality of LEDs ED may be transferred from the second substrate WF to the first auxiliary substrate CS. Then, a groove ILH may be formed on the upper surface of the plurality of first LEDs 140 among the plurality of LEDs ED transferred to the first auxiliary substrate CS. For example, grooves ILH may be formed on the upper surface of the initial first n-type semiconductor layer 143' of the plurality of first LEDs 140 in consideration of the thicknesses of the plurality of light conversion units 160, and a plurality of light conversion units 160 may be formed in the groove ILH. At this time, the thickness of the plurality of light conversion units 160 may be adjusted by adjusting the depth of the groove ILH, and the thickness of the plurality of light conversion units 160 may be determined so as to achieve the light conversion efficiency sufficient to convert light emitted from the plurality of LEDs ED into light of different colors. Thus, a method of manufacturing a display device 100 according to an embodiment of the present disclosure may easily adjust a depth of a plurality of grooves ILH as a space in which a plurality of light conversion units 160 is formed, and a plurality of the light conversion units 160 may be made to have a thickness having high light conversion efficiency. Therefore, the light emitted from the plurality of LEDs ED may be converted into light of another color through the plurality of light conversion units 160 having a sufficient thickness.

According to a method of manufacturing a display device 100 according to an embodiment of the present disclosure, a plurality of light conversion units 160 having a sufficient light conversion efficiency with a small amount of material may be formed by increasing a thickness of an n-type semiconductor material layer NL. First, an n-type semiconductor material layer NL is grown thick on the second substrate WF. For example, the n-type semiconductor material layer NL may be grown to have a thickness of at least 3 μm or more. The plurality of LEDs ED is formed by processing an epi layer EP including the n-type semiconductor material layer NL, and then a plurality of LEDs ED may be transferred onto the first auxiliary substrate CS. The plurality of transferred LEDs ED may include the initial first n-type semiconductor material layer 143' disposed on the uppermost thereof made of the n-type semiconductor material layer NL. A groove ILH may be formed on the upper surface of the initial first n-type semiconductor layer 143', and a plurality of the light conversion units 160 may be formed in the groove ILH. In order to form a plurality of light conversion units 160 in the groove ILH, a plurality of light conversion units 160 may be formed in a manner of selectively forming a material of the plurality of light conversion units 160 in the groove ILH. Therefore, in the method of manufacturing the display device 100 according to an embodiment of the present disclosure, compared with a conventional method of applying phosphors on the entire surface of a plurality of LEDs, a plurality of light conversion units 160 are selectively provided in the groove ILH. Accordingly, it may be possible to form a plurality of light conversion units 160 with a small amount of material. Accordingly, a method of manufacturing the display device 100 according to an embodiment of the present disclosure may form a groove ILH containing a plurality of light conversion units 160 at the upper surface of the initial first n-type semiconductor layer 143' of the plurality of first LEDs 140. Therefore, a plurality of the light conversion units 160 may be formed of a small amount of material.

Figure 4:
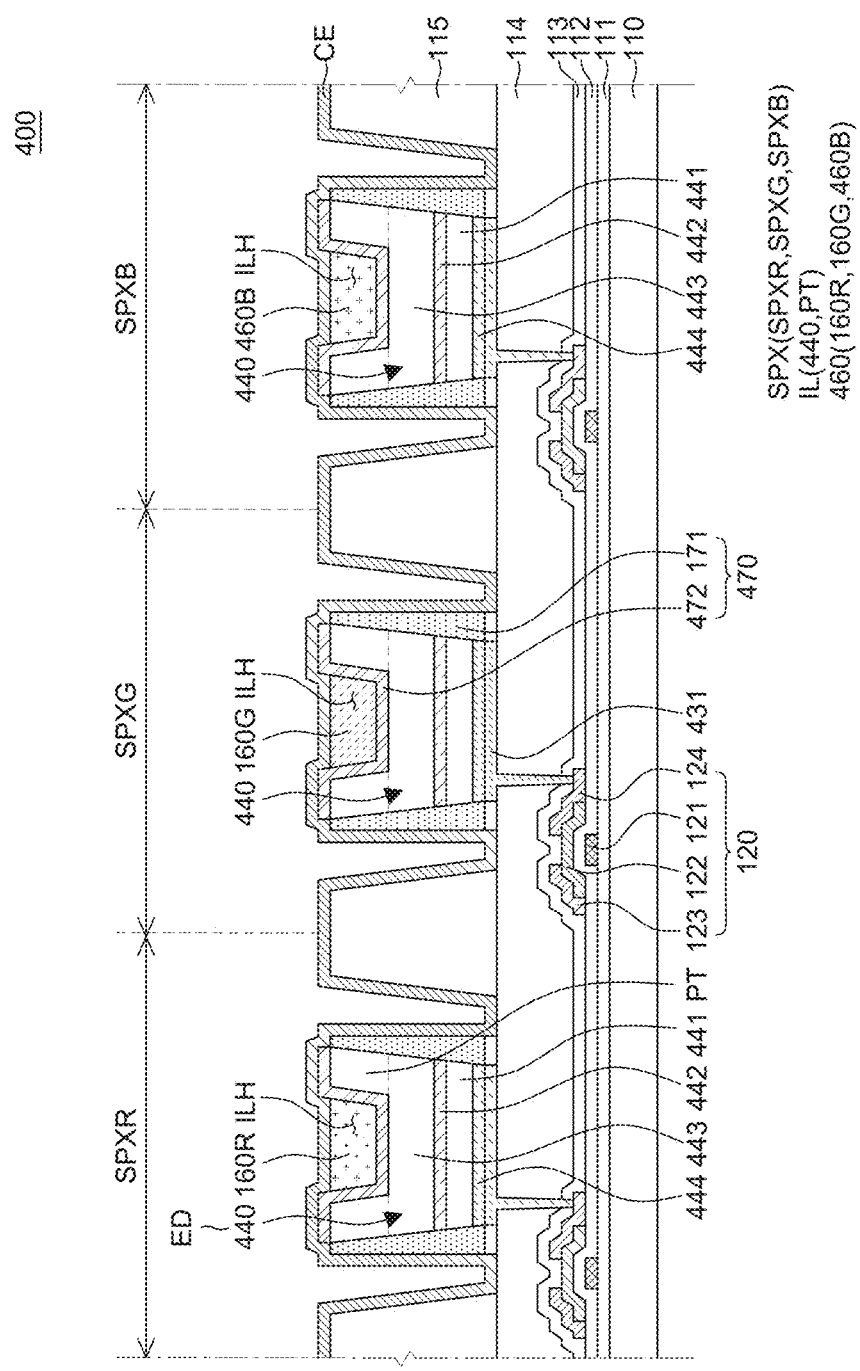
FIG. 4 is a cross-sectional view of a display device according to another embodiment of the present disclosure.

FIG. 4 is a cross-sectional view of a display device according to another embodiment of the present disclosure. When comparing the display device 400 of FIG. 4 to the display device 100 of FIGS. 1 to 3M, elements such as a plurality of first LEDs 440, a plurality of light conversion units 460, a contact electrode 431, a second reflector 472 may be different, and only a plurality of first LEDs 440 may be disposed instead of the plurality of second LEDs 150. Otherwise, the configurations may be substantially the same. Thus, redundant descriptions will be omitted.

With reference to FIG. 4, a plurality of first LEDs 440, a plurality of partitions PT, and a plurality of light conversion units 460 are disposed in each of a plurality of sub-pixels SPX. For example, each of the plurality of sub-pixels SPX may include a plurality of inorganic light emitting structures IL including a plurality of first LEDs 440 and a plurality of partitions PT, a plurality of light conversion units 460, and a reflector 470.

The plurality of first LEDs 440 disposed in each of the plurality of sub-pixels SPX may be an LED ED emitting light of the same wavelength. For example, the plurality of first LEDs 440 may be an LED that emits blue light in a visible light region, or an LED that emits light in an ultraviolet region that is an invisible light. Hereinafter, for convenience of description, it is assumed that the plurality of first LEDs 440 emit light in the ultraviolet region, but the present disclosure is not limited thereto.

The first p-type electrode 444 of each of the plurality of first LEDs 440 is disposed on an overall lower surface of the first p-type semiconductor layer 441. The contact electrode 431 is arranged to overlap with the first p-type electrode 444 so as to correspond to the first p-type electrode 444. Therefore, each of the first p-type electrode 444 and the plurality of contact electrodes 431 may be disposed so as to overlap the plurality of first light emitting layers 442, and a plurality of first p-type electrodes 444 and a plurality of contact electrode 431 may reflect light emitted to the lower side of the plurality of LEDs ED among the light emitted from the plurality of LEDs ED to the upper side of the first substrate 110. Accordingly, by forming the plurality of first p-type electrodes 444 and the plurality of contact electrodes 431 on an overall surface of the first p-type semiconductor layer 441, the third reflector 173 as shown in FIG. 2A may be omitted. Further, as the area of the first p-type electrode 444 of the plurality of LEDs ED and the area of the plurality of contact electrodes 431 increase, the alignment margin between the first p-type electrode 444 of the plurality of LEDs ED and the plurality of contact electrodes 431 may be ensured when the plurality of LEDs ED are transferred onto the first substrate 110.

A plurality of light conversion units 460 is disposed on the plurality of first LEDs 440. For example, the red light conversion unit 160R may be disposed on the first LED 440 of the red sub-pixel SPXR and the green light conversion unit 160G may be disposed on the first LED 440 of the green sub-pixel SPXG, and the blue light conversion unit 460B may be disposed on the first LED 440 of the blue sub-pixel SPXB.

Light in the ultraviolet ray region emitted from the plurality of first LEDs 440 is not visible light. Thus, it is not visible to a human eye. However, because the light in the ultraviolet region corresponds to a shorter wavelength than the blue light, it may be converted into light in the visible light region in a plurality of light conversion units 460 that convert light having a short wavelength into light having a long wavelength.

The second reflector 472 allows light in the ultraviolet region emitted from the plurality of first LEDs 440 to pass therethrough and reflects light in the visible light region converted in the plurality of the light conversion units 460. The second reflector 472 may transmit light in the ultraviolet region emitted from the plurality of first LEDs 440, so that the light in the ultraviolet region emitted from the plurality of first LEDs 440 is absorbed by the phosphor of the plurality of light conversion units 460 and converted into light in the visible light region. In addition, in order to suppress absorption of the visible light, converted by the plurality of light conversion units 460 and directed toward the plurality of first LEDs 440, by the plurality of first LEDs 440, the second reflector 472 may reflect the light in the visible light region converted by the plurality of light conversion units 460.

The display device 400 according to another embodiment of the present disclosure may improve the light efficiency by disposing a plurality of first LEDs 440 that emit light in the ultraviolet region and a plurality of light conversion units 460. For example, a plurality of first LEDs 440 that emit light in the ultraviolet region is disposed in each of the plurality of sub-pixels SPX, and a plurality of light conversion units 460 is arranged on the plurality of first LEDs 440. When the light in the ultraviolet region is converted by the plurality of light conversion units 460, it may be converted into light having a very wide wavelength spectrum and a high color rendering index (CRI) may be ensured. Accordingly, a plurality of first LEDs 440 that emit light in an ultraviolet ray region that is an invisible light ray region not visible to a human eye is disposed on the display device 400, and a plurality of light conversion units 460 for converting the light emitted from the plurality of first LEDs 440 into a light in the region visible to a human eye may be disposed to realize an image. Accordingly, in the display device 400 according to another embodiment of the present disclosure, a plurality of light conversion units 460 is disposed on a plurality of first LEDs 440 that emit light in an invisible light region, and may convert the light into the visible light region of high color purity.

Figure 5:
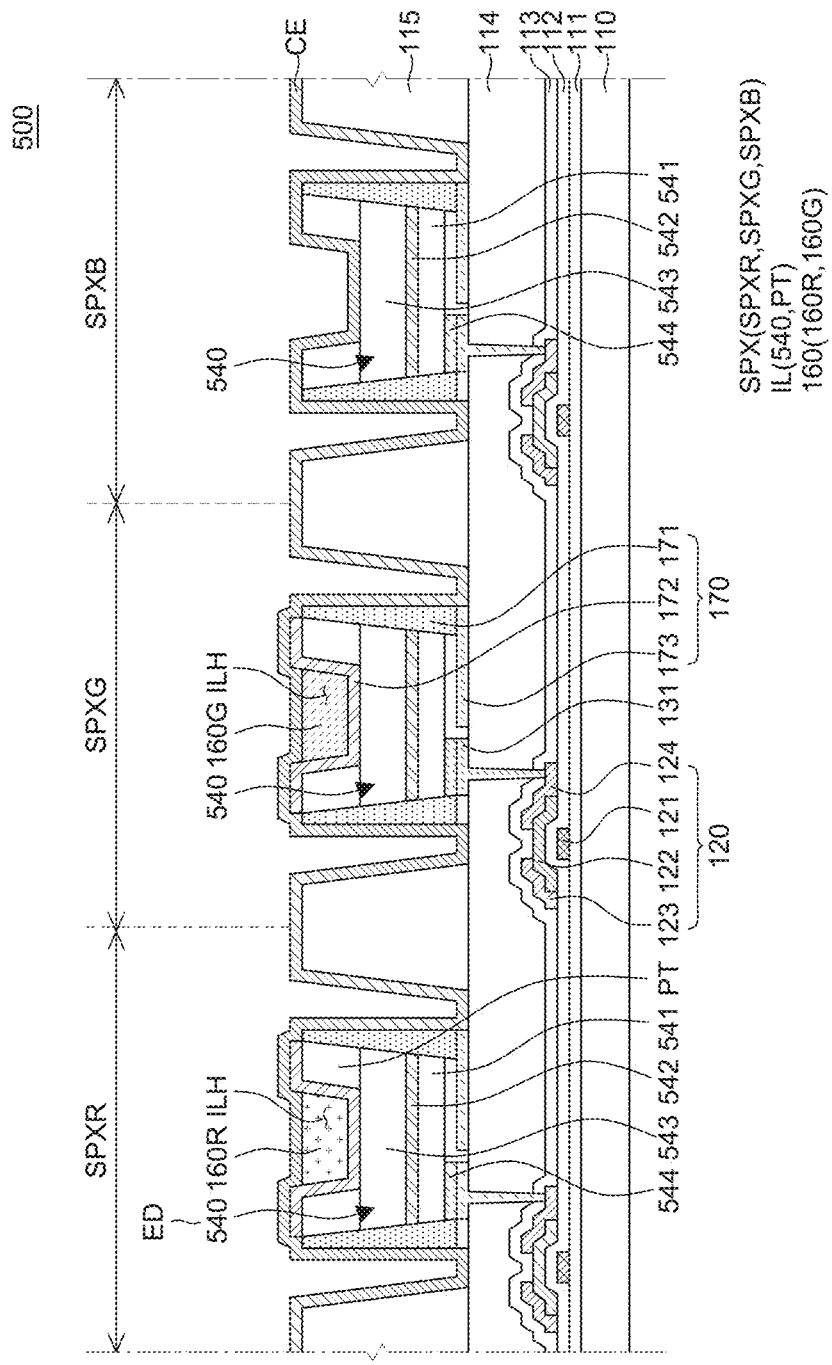
FIG. 5 is a cross-sectional view of a display device according to another embodiment of the present disclosure.

FIG. 5 is a cross-sectional view of a display device according to another embodiment of the present disclosure. The display device 500 of FIG. 5 may differ from the display device 100 of FIGS. 1 to 3M in that a plurality of the first LEDs 540 and the partitions PT are different, and only a plurality of first LEDs 540 is provided instead of providing a plurality of the second LEDs 150. Other elements may be substantially the same. Thus, redundant descriptions will be omitted.

With reference to FIG. 5, a plurality of first LEDs 540 and a plurality of partitions PT are disposed in each of a plurality of sub-pixels SPX. A plurality of inorganic light emitting structures IL including a plurality of first LEDs 540 and a plurality of partitions PT is disposed in each of the plurality of sub-pixels SPX.

The plurality of first LEDs 540 disposed in each of the plurality of sub-pixels SPX may be an LED ED emitting light of the same wavelength. For example, the plurality of first LEDs 540 may be an LED ED that emits blue light in a visible light region, or an LED ED that emits light in an ultraviolet region that is an invisible light. Hereinafter, for convenience of description, it is assumed that the plurality of first LEDs 540 emits blue light, but the present disclosure is not limited thereto.

A plurality of partitions PT is disposed on the plurality of first LEDs 540. Each of the plurality of partitions PT is disposed to be in contact with the upper surface of the first n-type semiconductor layer 543 of the plurality of first LEDs 540. A groove ILH in which a plurality of light conversion units 160 are accommodated on a plurality of first LEDs 540 may be defined by a plurality of partitions PT and a first n-type semiconductor layer 543 of a plurality of first LEDs 540.

The plurality of partitions PT may be formed of a material different from the first n-type semiconductor layer 543 of the plurality of first LEDs 540. The plurality of partitions PT may be formed of the same material as the second substrate WF, e.g., the wafer on which the plurality of first LEDs 540 is grown. For example, the plurality of partitions PT may be formed of one among sapphire, silicon (Si), gallium nitride (GaN), gallium arsenide (GaAs), gallium phosphide (GaP), and silicon carbide (SiC).

For example, the plurality of partitions PT may reduce the thickness of the second substrate WF by processing a lower surface of a second substrate WF having a plurality of first LEDs 540 formed on an upper surface thereof to correspond to the depths of the plurality of light conversion units 160. Next, a plurality of partitions PT may be formed by forming a groove ILH exposing the upper surface of the plurality of first LEDs 540 on the second substrate WF whose thickness is reduced.

In another example, a plurality of grooves ILH and a partition PT may be formed by transferring a plurality of first LEDs 540 to the first auxiliary substrate CS, and then forming a partition PT on the plurality of first LEDs 540 by etching a material forming the partition PT to expose the upper surface of the plurality of first LEDs 540 after the material is formed. Thus, the plurality of partitions PT may be formed.

In FIG. 5, it is illustrated that the grooves ILH on the plurality of inorganic light emitting structures IL in which the plurality of light conversion units 160 is accommodated are defined by the upper surface of the plurality of first n-type semiconductor layers 543 and the plurality of partitions PT. However, it may be possible that the groove ILH may extend to the plurality of first n-type semiconductor layers 543, but the present disclosure is not limited thereto.

A plurality of light conversion units 160 is disposed only in the red sub-pixel SPXR and the green sub-pixel SPXG among the plurality of sub-pixels SPX. The blue light emitted from the plurality of first LEDs 540 may be converted into red light and green light through the plurality of light conversion units 160. For example, a red light conversion unit 160R may be disposed on the first LED 540 of the red sub-pixel SPXR to convert blue light into red light, and a green light conversion unit 160G may be disposed on the first LED 540 of the green sub-pixel SPXG to convert blue light into green light.

The plurality of light conversion units 160 are not disposed in the blue sub-pixel SPXB among the plurality of sub-pixels SPX. A plurality of first LEDs 540 arranged in the blue sub-pixel SPXB may also include a partition PT arranged on the plurality of first LEDs 540 so that a groove ILH may be formed. However, an additional light conversion unit 160 may not be provided in the groove ILH.

In FIG. 5, it is illustrated that a separate light conversion unit 160 is not disposed on the first LED 540 of the blue sub-pixel SPXB. However, it may be possible that a light conversion unit made of a transparent material may be separately disposed on the first LED 540, but the present disclosure is not limited thereto.

The display device 500 according to the another embodiment of the present disclosure may form a groove ILH accommodating a plurality of light conversion units 160 on a plurality of first LEDs 540 using a second substrate WF on which the plurality of first LEDs 540 is grown. The thicknesses of the plurality of light conversion units 160 may be determined by the plurality of partitions PT disposed on the plurality of first LEDs 540. The height of the plurality of partitions PT may be increased to increase the thickness of the plurality of light conversion units 160 and the light emitted from the plurality of LEDs ED may be sufficiently absorbed and converted into light of a different color by the phosphors of the plurality of light conversion units 160. At this time, a plurality of partitions PT may be formed of a material different from a material of the first n-type semiconductor layer 543 of the plurality of first LEDs 540 by processing the wafer instead of peeling off the wafer, and the wafer may be a second substrate WF on which the plurality of first LEDs 540 is grown. Further, by forming the plurality of partitions PT, a groove ILH in which a plurality of light conversion units 160 are accommodated on the first n-type semiconductor layer 543 of the plurality of first LEDs 540 may be defined. Accordingly, when the epi layer EP for forming the plurality of first LEDs 540 is grown on the second substrate WF, the second substrate WF may be processed to form a groove ILH in which a plurality of the light conversion units 160 are accommodated, instead of growing the thickness of the n-type semiconductor material layer NL of the epi layer EP. Therefore, the growth time and cost of the epi layer EP may be reduced. Accordingly, the thickness of the plurality of light conversion units 160 may be increased to improve the light conversion efficiency.

Figure 6:
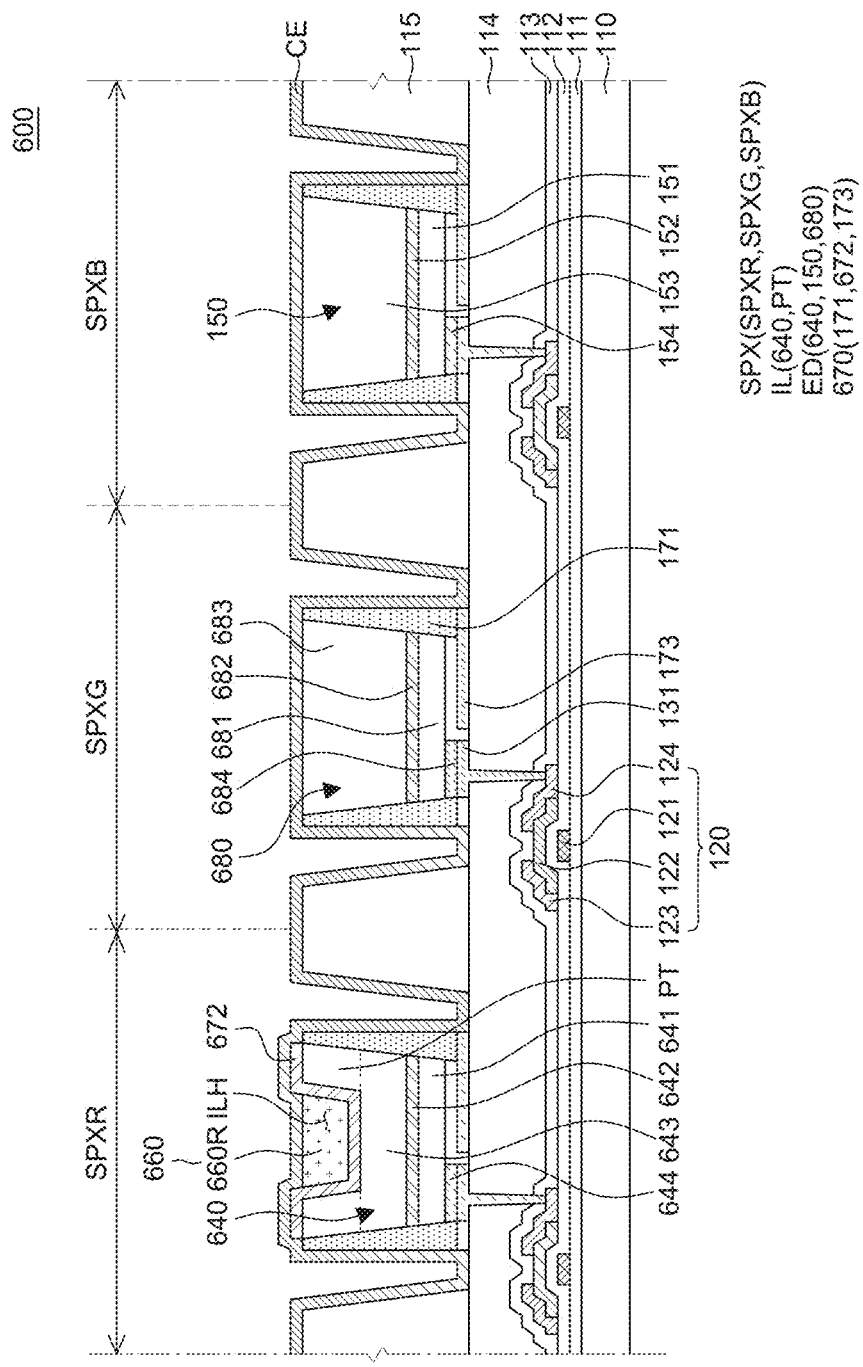
FIG. 6 is a cross-sectional view of a display device according to another embodiment of the present disclosure.

FIG. 6 is a cross-sectional view of a display device according to another embodiment of the present disclosure. The display device 600 of FIG. 6 may differ from the display device 100 of FIGS. 1 to 3M in that only a plurality of LEDs ED, a light conversion unit 660 and a plurality of second reflector 672 may be different, the third LED 680 is further provided, and the other elements may be substantially the same. Thus, redundant descriptions will be omitted.

With reference to FIG. 6, a plurality of LEDs ED is disposed in each of a plurality of sub-pixels SPX. For example, a first LED 640 having a partition PT and a light conversion unit 660 is disposed on a red sub-pixel SPXR among a plurality of sub-pixels SPX, a second LED 150 is disposed in a blue sub-pixel SPXB, and a third LED 680 is disposed in a green sub-pixel SPXG. That is, an inorganic light emitting structure IL is disposed in the red sub-pixel SPXR, and only the second LED 150 and the third LED 680 are disposed in the blue sub-pixel SPXB and the green sub-pixel SPXG, respectively.

The first LED 640 disposed in the red sub-pixel SPXR may be an LED ED emitting green light or blue light having a shorter wavelength than red light. Therefore, the inorganic light emitting structure IL disposed in the red sub-pixel SPXR may be a green inorganic light emitting structure IL or a blue inorganic light emitting structure IL. Hereinafter, the first LED 640 is assumed to be a green LED ED for emitting green light and the green inorganic light emitting structure IL is disposed for a red sub-pixel SPXR, but the present disclosure is not limited thereto.

The light conversion unit 660 is disposed in the groove ILH of the inorganic light emitting structure IL of the red sub-pixel SPXR. The light conversion unit 660 includes only the red light conversion unit 660R. For example, the red light conversion unit 660R may be disposed in the groove ILH defined by the partition PT on the first LED 640 and the upper surface of the first LED 640. The red light conversion unit 660R may convert green light emitted from the first LED 640 into red light.

A second reflector 672 is disposed between the first LED 640 and the red light conversion unit 660R. The second reflector 672 may transmit the light in the wavelengths range corresponding to the green light emitted from the first LED 640 and may reflect the light in the wavelengths range corresponding to the red light converted by the red light conversion unit 660R.

It is illustrated in FIG. 6 that the first LED 640 emitting green light is disposed in the red sub-pixel SPXR. However, the red sub-pixel SPXR may be provided with an LED that emits blue light in accordance with the light absorption characteristics of the phosphor of the red light conversion unit 660R, but the present disclosure is not limited thereto.

The third LED 680 disposed in the green sub-pixel SPXG may be an LED that emits green light like the first LED 640 disposed in the red sub-pixel SPXR, and a separate light conversion unit 660 may not be disposed in the green sub-pixel SPXG where the third LED 680 is disposed. The third LED 680 disposed in the green sub-pixel SPXG emits green light so that the light emitted from the third LED 680 may be emitted to the upper side of the first substrate 110 as it is.

The second LED 150 disposed in the blue sub-pixel SPXB is an LED ED emitting blue light, and a separate light conversion unit 660 may not be disposed in the blue sub-pixel SPXB where the second LED 150 is disposed. The second LED 150 disposed in the blue sub-pixel SPXB emits blue light so that the light emitted from the second LED 150 may be emitted directly to the upper side of the first substrate 110.

The plurality of LEDs ED may be LEDs grown on the same second substrate WF. For example, the first LED 640 and the third LED 680 that emit green light among the plurality of LEDs ED and the second LED 150 that emits blue light disposed on the same second substrate WF may be grown together. First, the epi layer EP for forming the second LED 150 may be grown on the second substrate WF, and then the second LED 150 may be formed by etching the epi layer EP. The epi layer EP may be etched while leaving a portion of the n-type semiconductor material layer NL of the epi layer EP disposed at the position where the first LED 640 and the third LED 680 are to be formed. Then, the epi layer EP may be grown again on the remaining portion of the n-type semiconductor material layer NL. The amount of indium contained in the light emitting material layer EL may be controlled to emit green light having a wavelength longer than that of blue light in the first light emitting layer 642 and the third light emitting layer 682. Then, the first LED 640 and the third LED 680 may be formed by etching the epi layer EP. Accordingly, the first LED 640 and the third LED 680 emitting green light and the second LED 150 emitting blue light are formed on the same second substrate WF, e.g., LEDs ED that are grown together on the wafer.

The display device 600 according to the another embodiment of the present disclosure may realize light of various colors including white light by arranging a plurality of LEDs ED emitting blue light and green light and a red light conversion unit 660R. First, the first LED 660 and the third LED 680 that emit green light and the second LED 150 that emits blue light among the plurality of LEDs ED may be grown together and formed on the same second substrate WF. Then, a third LED 680 emitting green light may be disposed in the green sub-pixel SPXG to emit green light to the upper side of the first substrate 110 in the green sub-pixel SPXG. The second LED 150 for emitting blue light may be disposed in the blue sub-pixel SPXB so that blue light is emitted to the upper side of the first substrate 110 in the blue sub-pixel SPXB. At this time, the first LED 640 emitting green light and the red light conversion unit 660R are disposed together in the red sub-pixel SPXR so that red light is emitted from the red sub-pixel SPXR to the upper side of the first substrate 110. Accordingly, in the display device 600 according to the another embodiment of the present disclosure, only a plurality of LEDs ED that emit blue light and green light and a red light conversion unit 660R are disposed, thereby displaying an image with various colors.

Figure 7:
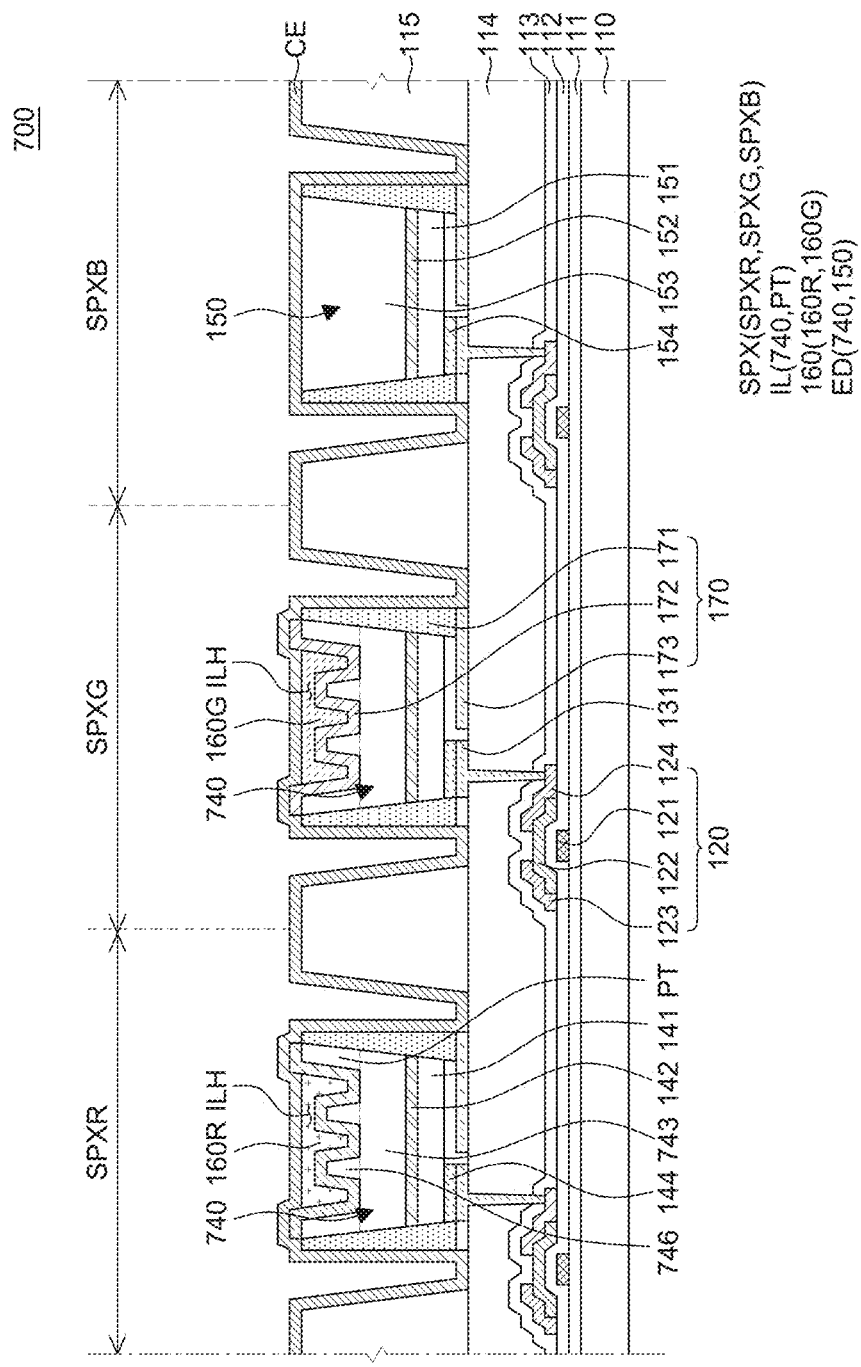
FIG. 7 is a cross-sectional view of a display device according to another embodiment of the present disclosure.

FIG. 7 is a cross-sectional view of a display device according to another embodiment of the present disclosure. The display device 700 of FIG. 7 may further include a plurality of protrusions 746 as compared with the display device 100 of FIGS. 1 to 3M, and other elements may be substantially the same. Thus, redundant descriptions will be omitted.

With reference to FIG. 7, a plurality of protrusions 746 protruding from the upper surface of the first n-type semiconductor layer 743 of the plurality of first LEDs 740 is disposed. That is, each of the plurality of inorganic light emitting structures IL includes a plurality of protrusions 746 protruding from the bottom surface of the groove ILH. The plurality of protrusions 746 may protrude from the upper surface of the first n-type semiconductor layer 743 of the plurality of first LEDs 740 exposed from the plurality of partitions PT. The plurality of protrusions 746 may be disposed to protrude from the bottom surface of the groove ILH.

The plurality of protrusions 746 may be integrated with the first n-type semiconductor layer 743. That is, the plurality of protrusions 746 may be made of the same material as the first n-type semiconductor layer 743.

The plurality of protrusions 746 improve the contact area between the first n-type semiconductor layer 743 of the plurality of first LEDs 740 and the plurality of light conversion units 160 with the second reflector 172 interposed therebetween, thereby improving the converting efficiency of the plurality of light conversion units 160 with respect to the light emitted from the plurality of first light emitting layers 142. As the contact area between the first n-type semiconductor layer 743 and the plurality of the light conversion units 160 is increased, the possibility that the light from the first light emitting layer 142 is absorbed by the phosphors of the plurality of light conversion units 160 may be increased. Thus, the light conversion efficiency may be improved.

A plurality of light conversion units 160 is disposed on the plurality of first LEDs 740 to cover the plurality of protrusions 746 and the groove ILH. The plurality of light conversion units 160 may be arranged to cover the upper surface of the plurality of protrusions 746. That is, the upper surface of the plurality of protrusions 746 may be disposed inside the plurality of the light conversion units 160, and the height of the plurality of protrusions 746 may be smaller than the thickness of the plurality of the light conversion units 160.

Light emitted from the first light emitting layer 142 of the plurality of first LEDs 740 may be irradiated to the plurality of light conversion units 160 through the first n-type semiconductor layer 743. The light from the first light emitting layer 142 may be directed toward the plurality of light conversion units 160 through the upper surface of the first n-type semiconductor layer 743 and the plurality of protrusions 746. In this case, when the upper surface of the plurality of protrusions 746 is disposed outside the plurality of the light conversion units 160, the light emitted from the upper surface of the plurality of protrusions 746 may not be converted by the plurality of light conversion units 160. Therefore, the plurality of light conversion units 160 are arranged to cover the upper surface of the plurality of protrusions 746, so that light emitted from the upper surface of the plurality of protrusions 746 may be converted into light of different colors.

The display device 700 according to the another embodiment of the present disclosure may improve the light conversion efficiency at the plurality of light conversion units 160 by arranging a plurality of protrusions 746 protruding from the upper surface of the plurality of first LEDs 740. Light emitted from the first light emitting layer 142 of the plurality of first LEDs 740 may be absorbed by the phosphors of the plurality of light conversion units 160 and converted into lights of different colors. At this time, a plurality of protrusions 746 protruding from the upper surface of the plurality of first LEDs 740, e.g., the upper surface of the first n-type semiconductor layer 743, are disposed. The plurality of protrusions 746 may be disposed so as to protrude toward the inside of the plurality of light conversion units 160. Therefore, the light from the first light emitting layer 142 of the plurality of first LEDs 740 may be emitted more toward the plurality of light conversion units 160 through the plurality of protrusions 746 so that the light conversion unit 160 may absorb more light from the first light emitting layer 142 and convert the light into light of a different color. Accordingly, the display device 700 according to the another embodiment of the present disclosure increases the contact area of the plurality of first LEDs 740 and the plurality of light conversion units 160 with the second reflector 172 interposed therebetween. Therefore, the light conversion efficiency of the plurality of light conversion units 160 may be improved.

The example embodiments of the present disclosure may also be described as follows.

A display device according to an embodiment of the present disclosure may include a first substrate including a plurality of pixels; a plurality of light emitting diodes (LEDs) in each of the plurality of pixels; a plurality of light conversion units on the plurality of LEDs; and a plurality of partitions configured to surround each of the plurality of light conversion units, wherein each of the plurality of light conversion units is in a groove inside the plurality of partitions.

Some of the plurality of LEDs may each include a p-type semiconductor layer on the first substrate; a light emitting layer on the p-type semiconductor layer; and an n-type semiconductor layer on the light emitting layer, wherein the plurality of partitions and the n-type semiconductor layer are formed as one body with a same material.

Some of the plurality of LEDs may each include a plurality of protrusions protruding from an upper side of the n-type semiconductor layer; and an upper surface of the plurality of protrusions is inside the plurality of light conversion units.

A material of the plurality of protrusions may be the same as a material of the n-type semiconductor layer.

A material of the plurality of partitions may be at least one among sapphire, silicon, gallium nitride, gallium arsenide, gallium phosphide, and silicon carbide.

The display device may further include a first reflector configured to surround an outer surface of the plurality of LEDs and an outer surface of the plurality of partitions.

The display device may further include a second reflector between the plurality of light conversion units and the plurality of LEDs and between the plurality of light conversion units and the plurality of partitions, wherein the second reflector is configured to transmit light emitted from the plurality of LEDs, and wherein the second reflector is configured to reflect light having a longer wavelength than the light emitted from the plurality of LEDs.

Some of the plurality of LEDs may emit light having a wavelength spectrum correspond to a green color, and the remainder of the plurality of LEDs may emit light having a wavelength spectrum correspond to a blue color.

The plurality of LEDs may emit light having the same wavelength spectrum.

The plurality of LEDs emit may light having an ultraviolet wavelength spectrum, and the plurality of light conversion units may overlap the plurality of LEDs in plan view.

A display device according to another embodiment of the present disclosure may include a first substrate on which a plurality of sub-pixels is defined; a plurality of inorganic light emitting structures in the plurality of sub-pixels, wherein an upper surface of the plurality of inorganic light emitting structures includes a groove; a plurality of light conversion units in the groove; and a first reflector between adjacent inorganic light emitting structures and configured to reflect light emitted from the plurality of inorganic light emitting structures to thereby improve light extraction efficiency of the plurality of inorganic light emitting structures.

The plurality of inorganic light emitting structures may include a plurality of first color inorganic light emitting structures and a plurality of second color inorganic light emitting structures; and the plurality of light conversion units are third color light conversion units.

The plurality of inorganic light emitting structures may emit light of the same wavelength; and the plurality of light conversion units may include a red light conversion unit and a green light conversion unit.

The plurality of light conversion units may further include a blue light conversion unit.

The plurality of inorganic light emitting structures may include a plurality of light emitting diodes (LEDs) including a plurality of light emitting layers on the first substrate and a plurality of n-type semiconductor layers on the plurality of light emitting layers, wherein the groove of the plurality of inorganic light emitting structures is defined by a partition on at least a portion of the plurality of n-type semiconductor layers and configured to expose a portion of an upper surface of the plurality of n-type semiconductor layers.

The groove may include the upper surface of the plurality of n-type semiconductor layers; and the partition may include a same material as the n-type semiconductor layer.

Each of the plurality of LEDs may further include a plurality of protrusions protruding from a bottom surface of the groove; and a height of the plurality of protrusions is smaller than a thickness of the plurality of light conversion units.

The partition may surround each of the plurality of light conversion units, and a material of the partition may be different from a material of the plurality of n-type semiconductor layers.

A second reflector may be between the plurality of inorganic light emitting structures and the plurality of light conversion units, wherein the second reflector is configured to transmit light emitted from the plurality of inorganic light emitting structures and is configured to reflect light converted by the plurality of light conversion units to thereby improve extraction efficiency of the light converted by the plurality of light conversion units.

A display device according to another embodiment of the present disclosure may include a substrate; a pixel on the substrate, the pixel including a plurality of light-emitting diodes (LEDs); a light conversion unit in a groove on one or more of the LEDs; and a reflector in the groove between the one or more LEDs and the light conversion unit to reflect light converted by the light conversion unit.

A partition may surround the light conversion unit and define the groove on the one or more of the LEDs, wherein each of the one or more LEDs may include first and second semiconductor layers with a light emitting layer therebetween, and the partition may be integral with the second semiconductor layer.

A protrusion may protrude from the second semiconductor layer to be inside the light conversion unit, wherein the reflector may be disposed between the protrusion and the light conversion unit.

Although the embodiments of the present disclosure have been described in detail with reference to the accompanying drawings, it is to be understood that the present disclosure is not limited to those embodiments and various changes and modifications may be made without departing from the scope of the present disclosure. Therefore, the embodiments disclosed in the present disclosure are intended to illustrate rather than limit the scope of the present disclosure, and the scope of the technical idea of the present disclosure is not limited by these embodiments. Therefore, it should be understood that the above-described embodiments are illustrative in all aspects and not restrictive. The scope of the present disclosure should be construed according to the claims, and all technical ideas within the scope of equivalents should be construed as falling within the scope of the present disclosure.

It will be apparent to those skilled in the art that various modifications and variations can be made in the display device of the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
    a first substrate on which a plurality of pixels are defined;
    a plurality of light emitting diodes (LEDs) in each of the plurality of pixels and including a plurality of first LEDs;
    a plurality of light conversion units on the plurality of first LEDs;
    a plurality of partitions configured to surround each of the plurality of light conversion units,
    a second reflector between the plurality of light conversion units and the plurality of first LEDs and between the plurality of light conversion units and the plurality of partitions;
    a first reflector configured to cover a side surface of the plurality of LEDs and an outer side surface of the plurality of partitions; and
    a common electrode disposed on the plurality of LEDs in at least two pixels and configured to surround an upper surface and the side surface of the plurality of LEDs and the first reflector,
    wherein one of the plurality of light conversion units is in a groove defined by the plurality of first LEDs and the plurality of partitions,
    wherein the plurality of partitions is disposed to overlap the plurality of first LEDs,
    wherein the second reflector is configured to transmit light emitted from the plurality of first LEDs,
    wherein the second reflector is configured to reflect light having a longer wavelength than the light emitted from the plurality of first LEDs, and
    wherein each of the plurality of partitions is configured to be integral with each of the plurality of first LEDs, and each of the plurality of partitions and the groove are disposed above each of the plurality of first LEDs.

2. The display device of claim 1,
    wherein the plurality of first LEDs each include:
    a p-type semiconductor layer on the first substrate;
    a light emitting layer on the p-type semiconductor layer; and an n-type semiconductor layer on the light emitting layer,
wherein the plurality of partitions and the n-type semiconductor layer are formed as one body with a same material.

3. The display device of claim 2, wherein:
the plurality of first LEDs each further includes a plurality of protrusions protruding from an upper side of the n-type semiconductor layer; and
an upper surface of the plurality of protrusions is inside the plurality of light conversion units.

4. The display device of claim 3, wherein a material of the plurality of protrusions is the same as a material of the n-type semiconductor layer.

5. The display device of claim 1, wherein a material of the plurality of partitions is at least one among sapphire, silicon, gallium nitride, gallium arsenide, gallium phosphide, and silicon carbide.

6. The display device of claim 1, wherein the plurality of first LEDs emits light having the same wavelength spectrum.

7. The display device of claim 6,
wherein the plurality of first LEDs emit light having an ultraviolet wavelength spectrum, and
wherein the plurality of light conversion units overlap the plurality of first LEDs in plan view.

8. A display device, comprising:
a first substrate on which a plurality of sub-pixels is defined;
a plurality of inorganic light emitting structures in the plurality of sub-pixels, wherein an upper surface of each of the plurality of inorganic light emitting structures includes a groove;
a plurality of light conversion units on the plurality of inorganic light emitting structures, wherein one of the plurality of light conversion units is in the groove;
a first reflector between adjacent inorganic light emitting structures and configured to reflect light emitted from the plurality of inorganic light emitting structures to thereby improve light extraction efficiency of the plurality of inorganic light emitting structures;
a second reflector between the plurality of inorganic light emitting structures and the plurality of light conversion units; and
a common electrode disposed on the plurality of inorganic light emitting structures and the plurality of light conversion units in at least two sub-pixels and configured to surround an upper surface and a side surface of the plurality of inorganic light emitting structures,
wherein the second reflector is configured to transmit light emitted from the plurality of inorganic light emitting structures and is configured to reflect light converted by the plurality of light conversion units to thereby improve extraction efficiency of the light converted by the plurality of light conversion units,
wherein the first reflector is disposed between the common electrode and the side surface of the plurality of inorganic light emitting structures,
wherein the plurality of inorganic light emitting structures includes:
a plurality of first light emitting diodes (LEDs) including a plurality of light emitting layers on the first substrate and a plurality of n-type semiconductor layers on the plurality of light emitting layers,
wherein the groove of the plurality of inorganic light emitting structures is defined by a partition on at least a portion of the plurality of n-type semiconductor layers, and
wherein the partition and the groove are disposed above each of the plurality of first LEDs.

9. The display device of claim 8, wherein:
the plurality of inorganic light emitting structures includes a plurality of first color inorganic light emitting structures and a plurality of second color inorganic light emitting structures; and
the plurality of light conversion units are third color light conversion units.

10. The display device of claim 8, wherein:
the plurality of inorganic light emitting structures emits light of the same wavelength; and
the plurality of light conversion units includes a red light conversion unit and a green light conversion unit.

11. The display device of claim 8, wherein the groove of the plurality of inorganic light emitting structures configured to expose a portion of an upper surface of the plurality of n-type semiconductor layers.

12. The display device of claim 11, wherein:
the groove includes the upper surface of the plurality of n-type semiconductor layers; and
the partition includes a same material as the n-type semiconductor layer.

13. The display device of claim 12, wherein:
each of the plurality of first LEDs further includes a plurality of protrusions protruding from a bottom surface of the groove; and
a height of the plurality of protrusions is smaller than a thickness of the plurality of light conversion units.

14. The display device of claim 11, wherein:
the partition surrounds each of the plurality of light conversion units, and
a material of the partition is different from a material of the plurality of n-type semiconductor layers.

15. The display device of claim 1, wherein the groove is disposed between the plurality of partitions.

* * * * *